(12) United States Patent
Arikan

(10) Patent No.: US 10,312,948 B1
(45) Date of Patent: Jun. 4, 2019

(54) METHOD AND SYSTEM FOR RETRANSMITTING DATA USING SYSTEMATIC POLAR CODING

(71) Applicant: Polaran Yazilim Bilisim Danismanlik Ithalat Ihracat Sanayi Ticaret Limited Sirketi, Bilkent, Cankaya, Ankara (TR)

(72) Inventor: Erdal Arikan, Ankara (TR)

(73) Assignee: Polaran Yazilim Bilisim Danismanlik Ithalat Ihracat Sanayi Ticaret Limited Sirketi, Bilkent (TR)

(*) Notice: Subject to any disclaimer, the term of this patent is extended or adjusted under 35 U.S.C. 154(b) by 0 days.

(21) Appl. No.: 15/967,138

(22) Filed: Apr. 30, 2018

(51) Int. Cl.
*H03M 13/00* (2006.01)
*H04L 1/18* (2006.01)

(52) U.S. Cl.
CPC ...... *H03M 13/6306* (2013.01); *H04L 1/1816* (2013.01); *H04L 1/1829* (2013.01)

(58) Field of Classification Search
CPC . H04L 1/1816; H04L 1/1829; H03M 13/6306
See application file for complete search history.

(56) References Cited

U.S. PATENT DOCUMENTS

| | | | |
|---|---|---|---|
| 8,347,186 | B1 | 1/2013 | Arikan |
| 2016/0080133 | A1* | 3/2016 | Golitschek Edler von Elbwart ............ H04W 72/0446 370/280 |
| 2016/0182187 | A1* | 6/2016 | Kim ...................... H03M 13/09 714/807 |
| 2016/0285479 | A1* | 9/2016 | El-Khamy ........ H03M 13/6368 |
| 2016/0323852 | A1* | 11/2016 | Golitschek Edler von Elbwart ............ H04W 72/0446 |
| 2017/0047947 | A1* | 2/2017 | Hong ................ H03M 13/2906 |
| 2017/0237530 | A1* | 8/2017 | Wesel ...................... H04L 1/22 375/295 |
| 2018/0034587 | A1* | 2/2018 | Kim ........................ H03M 5/12 |

(Continued)

OTHER PUBLICATIONS

E. Arikan, "Channel Polarization: A Method for Constructing Capacity-Achieving Codes for Symmetric Binary-Input Memoryless Channels," IEEE Transactions on Information Theory, vol. 55, No. 7, pp. 3051-3073, Jul. 2009.

(Continued)

*Primary Examiner* — Cynthia Britt

(57) ABSTRACT

A hybrid automatic repeat request (HARQ) transmitter in a communications system employing a HARQ process, wherein a primary codeword from an arbitrary forward error correction (FEC) code is sent over a communications channel and negatively acknowledged by a HARQ receiver, includes a polar code retransmission apparatus. A primary codeword buffer stores the primary codeword, and a systematic incremental redundancy (IR) encoder receives a first segment of the primary codeword and encodes the first segment into a first IR codeword. The first segment of the primary codeword excludes at least one symbol of the primary codeword, and the systematic IR encoder comprises a systematic polar encoder. Primary codeword segments, received in response to decoding errors, are encoded into IR codewords, with a kth segment $x_{S_k}$ of the primary codeword is excluded from retransmission of the kth IR codeword and the IR codewords may be permuted before transmission.

28 Claims, 14 Drawing Sheets

(56) References Cited

U.S. PATENT DOCUMENTS

2018/0205395 A1* 7/2018 Nammi ............. H03M 13/2906
2018/0331788 A1* 11/2018 Kim ...................... H04L 1/1893
2018/0367163 A1* 12/2018 Saber ................. H03M 13/1148

OTHER PUBLICATIONS

E. Arikan, "Systematic Polar Coding," IEEE Communications Letters, vol. 15, No. 8, pp. 860-862, Aug. 2011.

J.W. Byers, M. Luby, M. Mitzenmacher, and A. Rege, "A Digital Fountain Approach to Reliable Distribution of Bulk Data," in Proceedings of the ACM SIGCOMM '98 Conference on Applications, Technologies, Architectures, and Protocols for Computer Communication, New York, NY, USA, 1998, pp. 56-67.

D. Chase, "Code Combining—A Maximum-Likelihood Decoding Approach for Combining an Arbitrary Number of Noisy Packets," IEEE Transactions on Communications, vol. 33, No. 5, pp. 385-393, May 1985.

K. Chen, K. Niu, Z. He, and J. Lin, "Polar coded HARQ scheme with chase combining," in Wireless Communications and Networking Conference (WCNC), 2014 IEEE. IEEE, 2014, pp. 474-479.

K. Chen, K. Niu, and J. Lin, "A hybrid ARQ scheme based on polar codes," IEEE Communications Letters, vol. 17, No. 10, pp. 1996-1999, 2013.

M. El-Khamy, H.P. Lin, J. Lee, H. Mandavifar, and I. Kang, "HARQ rate-compatible polar codes for wireless channels," in Global Communications Conference (GLOBECOM), 2015 IEEE. IEEE, 2015, pp. 1-6.

B. Feng, Q. Zhang, and J. Jiao, "An Efficient Rateless Scheme Based on the Extendibility of Systematic Polar Codes," IEEE Access, vol. 5, pp. 23223-23232, Oct. 2017.

R1-167210, "HARQ scheme for polar codes", Huawei-HiSilicon, 3GPP TSG RAN WG1 Meeting #86, Gothenburg, Sweden, Aug. 2016, 4 pages.

B. Li, D. Tse, K. Chen, and H. Shen, "Capacity-achieving rateless polar codes," in 2016 IEEE International Symposium on Information Theory (ISIT), 2016, 14 pages.

S. Lin and D.J. Costello, "Chapter 22: Automatic-Repeat-Request Strategies", in: Error Control Coding, Second Edition, Upper Saddle River Pearson Education Inc., 2004, pp. 1156-1203.

M.S. Mohammadi, I.B. Collings, and Q. Zhang, "Simple Hybrid ARQ Schemes Based on Systematic Polar Codes for IoT Applications," IEEE Communications Letters, vol. 21, No. 5, pp. 975-978, May 2017.

E. Soljanin, N. Varnica, and P. Whiting, "Punctured vs rateless codes for hybrid ARQ," in Proc. IEEE Information Theory Workshop, Punta del Este., pp. 155-159, 2006.

Wang, R. and Liu, R., "A Novel Puncturing Scheme for Polar Codes", IEEE Communications Letters, 18(12), Dec. 2014, pp. 2081-2084.

D. Wu, A. Liu, Y. Zhang, and Q. Zhang, "Parallel concatenated systematic polar codes," Electronics Letters, vol. 52, No. 1, Jan. 2016, pp. 43-45.

* cited by examiner

| Function | Design Parameter | Input | Output |
|---|---|---|---|
| Generation of the primary codeword | A channel code with length parameters $(N,K)$ and generator matrix G | An input data packet d=$(d_1, d_2, ..., d_K)$ | A primary codeword x=$(x_1, x_2, ..., x_N)$ |
| Functional Block | Design Parameters | Input | Output |
| Generation of the $k$th IR codeword, $k = 1,...,m–1$ | $(N_k, K_k, S_k, M_k, A_k, V_k, T_k)$, subject to the constraints:<br>(i) $S_k \subset \{1,2,...,N\}$, with $\|S_k\| = K_k$<br>(ii) $A_k, V_k, T_k \subset \{1,2,...,M_k\}$<br>(iii) $A_k \cap V_k = \emptyset$<br>(iv) $\|A_k\| = \|S_k\|$<br>(v) $K_k < K$<br>(vi) $S_1, S_2, ..., S_{m-1}$ are distinct | $k$th segment $\mathbf{x}_{S\_k}$ of the main codeword x | $k$th IR codeword $\mathbf{r}^{(k)}$=<br>$(r_1^{(k)}, r_2^{(k)}, ..., r_{N\_k}^{(k)})$ |

| Param. | Value |
|---|---|
| $N$ | 16 |
| $K$ | 8 |
| $A$ | {16,8,12,14,15,4,6,10,7,11,13,2} |

91

| Param. | Value |
|---|---|
| $N_1$ | 16 |
| $K_1$ | 8 |
| $M_1$ | 32 |
| $S_1$ | {15,4,6,10,7,11,13,2} |
| $V_1$ | {25,26,27,28,29,30,31,32} |
| $A_1$ | {16,24,8,12,20,14,22,15} |
| $T_1$ | $A_1 \cup V_1$ |

92

| Param. | Value |
|---|---|
| $N_2$ | 16 |
| $K_2$ | 5 |
| $M_2$ | 32 |
| $S_2$ | {11,13,2,12,14} |
| $V_2$ | {22,23,24,25,26,27,28,29,30,31,32} |
| $A_2$ | {16,8,12,20,14} |
| $T_2$ | $A_2 \cup V_2$ |

93

| Param. | Value |
|---|---|
| $N_3$ | 16 |
| $K_3$ | 4 |
| $M_3$ | 32 |
| $S_3$ | {14,7,16,8} |
| $V_3$ | {21,22,23,24,25,26,27,28,29,30,31,32} |
| $A_3$ | {16,8,12,20} |
| $T_3$ | $A_3 \cup V_3$ |

METHOD AND SYSTEM FOR RETRANSMITTING DATA USING SYSTEMATIC POLAR CODING

TECHNICAL FIELD

The present application relates generally to retransmitting data over communication channels, more specifically, to retransmission systems employing systematic polar coding.

BACKGROUND

In many communication systems, such as wireless systems, the transmission channel varies unpredictably over time and the transmitter in the system cannot know in advance the quality of the channel. Various phenomena, such as thermal noise, multipath fading, Doppler effects, interference from other transmitters, may be the source of such channel variations and unpredictability of existing channel conditions. Communication systems employ forward error correction (FEC) coding schemes to provide reliable transmission of information over noisy and time-varying communication channels. In FEC schemes, the transmitter encodes input data packets into codewords from an error correcting code and transmits the codewords over the communication channel. The codewords carry redundant information about the input data packets and that redundancy renders the information in the input data packets more resilient against the corruption caused by the channel. The receiver in a FEC scheme is equipped with a decoder that aims to recover the input data packets from channel-corrupted copies of the transmitted codewords. When the channel conditions are worse than usual, e.g., during periods of deep fading, the receiver may fail to recover the input data packets from the corrupted codewords. Even for channels whose statistics are stationary in time, occasionally, the noise in the channel exceeds typical levels and the FEC code proves insufficient to recover the input data packet correctly.

In order to provide reliable communication in an effective manner in the face of adverse channel conditions, many communication systems employ Hybrid Automatic Repeat reQuest (HARQ) methods that combine FEC with error-detection and retransmission. In addition to a forward channel from the transmitter to the receiver, HARQ schemes require a feedback channel from the receiver to the transmitter. The feedback channel is used to send a feedback message that indicates whether the receiver was able to recover the input data packet successfully. In its rudimentary form a feedback message may be a positive acknowledgement (ACK) or a negative acknowledgement (NACK). An ACK indicates that the receiver decoded the current input data packet successfully; a NACK indicates the opposite. There are many varieties of HARQ schemes; a comprehensive discussion of the methods and issues regarding HARQ may be found in the reference [Lin, Chap. 22]. A description of fundamental concepts relating to general HARQ schemes follows.

HARQ schemes process input data packets in HARQ sessions, with each HARQ session comprising the transmission of a primary packet and possibly a number of additional HARQ packets, all derived from the same input data packet. A HARQ session begins with the HARQ transmitter receiving a new input data packet, encoding the input data packet into a primary codeword, placing the primary codeword in a primary packet, and transmitting the primary packet over the forward channel. If the HARQ receiver is able to recover the input data packet from the received primary packet, it sends an ACK; otherwise, it sends a NACK. Whenever the HARQ transmitter receives an ACK, the current HARQ session ends (with success), and a new HARQ session begins as soon as a new input data packet becomes available. Whenever the HARQ transmitter receives a NACK, it checks if the number of transmissions in the current HARQ session has reached a certain limit. If so, the current session terminates with failure; if not, the HARQ transmitter generates a new codeword from the current input data packet, places it in a HARQ packet, and transmits the HARQ packet over the forward channel. Upon receiving a new HARQ packet, the HARQ receiver attempts to recover the input data packet one more time, using the information available in the latest HARQ packet as well as the information in the packets received previously in the current HARQ session.

The limit on the number of packets that can be transmitted in a HARQ session is a design parameter typically determined by latency constraints for the particular type of data that is sent in the HARQ session. For example, real-time applications, such as voice transmission or remote control of machines, are less tolerant of latency, and the limit on the number of packets should be chosen accordingly. Applications such as file transfer to a cloud storage system, on the other hand, can tolerate much higher delays but require virtually error-free recovery of the input data packets, and the limit on the number of packets can be chosen large enough to ensure adequate reliability.

If the limit on the number of transmissions is reached with no ACK message being received by the HARQ transmitter, a communication system constrained mainly by latency may move to the transmission of the next input data packet, while one constrained by reliability may abort operations and send an alarm signal to a higher layer protocol. The specific details on how to handle this type of error event do not constrain the application of the present principles.

HARQ schemes provide reliability through "diversity." Diversity in HARQ may take the form of simple repetition such as in the "Chase Combining" (CC) method [Chase], or it may take the form of "Incremental Redundancy" (IR). In the CC-HARQ, the HARQ codewords are exact copies of the primary codeword. In IR-HARQ, the HARQ codewords can be any codeword derived from the current input data packet. A special form of providing diversity by IR is rateless coding [Byer]. The relation of rateless coding and HARQ coding is discussed in [Sol].

The present principles are directed primarily at constructing IR-HARQ schemes by using systematic polar codes. Polar codes are a newer type of linear block code introduced in the paper [Arik1], incorporated herein by reference and included in the file history of this application. In systematic codes, the input data packet appears transparently as part of the codeword. Systematic polar codes were first discussed in [Arik2] and recursive methods for systematic encoding of polar codes were disclosed in [Arik3]. Systematic coding has two main advantages in the context of polar coding. It improves the Bit Error Rate (BER) performance of polar codes as shown in [Arik2, Li]; and, it allows construction of "turbo-like" polar codes, as pointed out in [Arik2] and further studied in [Wu]. In fact, these advantages of systematic coding are not specific to polar coding; they hold over other code families, such as convolutional codes, and are well known to practitioners in the field.

Prior work includes numerous HARQ schemes based on polar codes. The proposals in [Chen1], [Moha] study Chase combining with polar codes. The methods in [Chen2], [ElKh], [Feng], [Huaw1], [Li], and [Song] are examples of IR-HARQ schemes. HARQ methods for polar codes involve shortening and puncturing as means of adjusting the length of polar codes to desired values. One method of shortening and puncturing a polar code is described in [Wang]; this method has the advantage of being simple.

The present disclosure proposes a new IR-HARQ method based on systematic polar coding together with shortening and puncturing of polar codes. The present principles can be applied as a HARQ scheme with any type of FEC code for generating a primary codeword. The present principles use systematic polar coding to generate the HARQ codewords. The present principles differ from the prior art in the manner systematic polar coding is used to generate the IR-HARQ codewords. It is an object of the present principles to improve throughput and reliability in transmitting data in a digital communication system. It is an object of the present principles to provide an improved IR-HARQ scheme using systematic polar codes.

Apart from HARQ applications, the present principles can be used as a standalone method for constructing rateless polar codes based on systematic encoding of data. Present principles comprise methods for encoding and decoding of rateless polar codes. It is an object of present principles to provide a rateless polar coding scheme based on systematic encoding of input data.

REFERENCES

[Arik1] E. Arikan, "Channel Polarization: A Method for Constructing Capacity-Achieving Codes for Symmetric Binary-Input Memoryless Channels," IEEE Transactions on Information Theory, vol. 55, no. 7, pp. 3051-3073, July 2009.
[Arik2] E. Arikan, "Systematic Polar Coding," IEEE Communications Letters, vol. 15, no. 8, pp. 860-862, August 2011.
[Arik3] E. Arikan, "Method and system for error correction in transmitting data using low complexity systematic encoder," U.S. Pat. No. 8,347,186 B1, 1 Jan. 2013.
[Byer] J. W. Byers, M. Luby, M. Mitzenmacher, and A. Rege, "A Digital Fountain Approach to Reliable Distribution of Bulk Data," in Proceedings of the ACM SIGCOMM '98 Conference on Applications, Technologies, Architectures, and Protocols for Computer Communication, New York, N.Y., USA, 1998, pp. 56-77.
[Chase] D. Chase, "Code Combining—A Maximum-Likelihood Decoding Approach for Combining an Arbitrary Number of Noisy Packets," IEEE Transactions on Communications, vol. 33, no. 5, pp. 385-393, May 1985.
[Chen1] K. Chen, K. Niu, Z. He, and J. Lin, "Polar coded HARQ scheme with chase combining," in Wireless Communications and Networking Conference (WCNC), 2014 IEEE. IEEE, 2014, pp. 474-479.
[Chen2] K. Chen, K. Niu, and J. Lin, "A hybrid ARQ scheme based on polar codes," IEEE Communications Letters, vol. 17, no. 10, pp. 1996-1999, 2013.
[ElKh] M. El-Khamy, H. P. Lin, J. Lee, H. Mandavifar, and I. Kang, "HARQ rate-compatible polar codes for wireless channels," in Global Communications Conference (GLOBECOM), 2015 IEEE. IEEE, 2015, pp. 1-6.
[Feng] B. Feng, Q. Zhang, and J. Jiao, "An Efficient Rateless Scheme Based on the Extendibility of Systematic Polar Codes," IEEE Access, vol. PP, no. 99, pp. 1-1, 2017.
[Huaw1] R1-167210, HARQ scheme for polar codes, Huawei-HiSilicon, 3GPP TSG RAN WG1 Meeting #86, Gothenburg, Sweden, August 2016.
[Li] B. Li, D. Tse, K. Chen, and H. Shen, "Capacity-achieving rateless polar codes," in 2016 IEEE International Symposium on Information Theory (ISIT), 2016, pp. 46-50.
[Lin] S. Lin and D. J. Costello, Error Control Coding, Second Edition. Upper Saddle River: Pearson Education Inc., 2004.
[Moha] M. S. Mohammadi, I. B. Collings, and Q. Zhang, "Simple Hybrid ARQ Schemes Based on Systematic Polar Codes for IoT Applications," IEEE Communications Letters, vol. PP, no. 99, pp. 1-1, 2017.
[Sol] E. Soljanin, N. Varnica, and P. Whiting, "Punctured vs rateless codes for hybrid ARQ," in Proc. IEEE Information Theory Workshop, Punta del Este., pp. 155-159, 2006.
[Song] H. Songnam, D. Hui, and I. Maric, "Rate-compatible polar codes," U.S. Patent Application Publication No. 2017/0047947, Feb. 2, 2017.
[Wang] Wang, R. and Liu, R. (2014) 'A Novel Puncturing Scheme for Polar Codes', IEEE Communications Letters, 18(12), pp. 2081-2084.
[Wu] D. Wu, A. Liu, Y. Zhang, and Q. Zhang, "Parallel concatenated systematic polar codes," Electronics Letters, vol. 52, no. 1, pp. 43-45, November 2015.

The above-listed publications are incorporated herein by reference.

SUMMARY

In data transmissions between a HARQ transmitter and a HARQ receiver, an input data packet is encoded by a primary encoder in the HARQ transmitter into a primary codeword. The primary codeword is placed inside a transmitted packet and sent by a packet transmitter over a forward channel. The transmitted packet is received as a received packet by the HARQ receiver.

In one embodiment, a HARQ transmitter apparatus for use in transmitting an input data packet in a communications system employing a HARQ protocol in a HARQ session with a maximum transmission limit m, wherein the maximum transmission limit m is an integer greater than or equal to 2, includes: a primary encoder configured to receive an input data packet to start the HARQ session and encode the input data packet into a primary codeword from a primary code; a packet transmitter configured to receive the primary codeword and transmit the primary codeword inside a primary packet over a communications channel; and a systematic incremental redundancy (IR) encoder configured to select a kth IR data segment, encode the kth IR data segment in a systematic manner into a kth IR mother codeword from a kth IR mother code, and produce a kth IR codeword from the kth IR mother codeword by a puncturing of the kth IR mother codeword. The packet transmitter receives the kth IR codeword and transmit the kth IR codeword inside a kth IR packet over the communications channel, wherein k is an integer greater than or equal to 1 and less than or equal to (m−1), wherein the kth IR data segment is a subvector of the primary codeword, and wherein the kth IR packet is transmitted in response to receiving a kth negative acknowledgement (NACK) in the HARQ session. The HARQ session ends when one of a positive acknowledgement (ACK) is received in response to a packet transmitted in the HARQ session or a number of packets transmitted in the HARQ session reaches the maximum transmission limit m. Optional puncturing of the kth IR mother codeword removes a systematic segment of the kth IR mother codeword, wherein the systematic segment of the kth IR mother codeword is a subvector of the kth IR mother codeword, and wherein the systematic segment of the kth IR mother codeword carries the kth IR data segment in the systematic manner. The HARQ encoder may apply a permutation to the kth IR data segment before encoding the kth IR data segment into the kth IR mother codeword in the systematic manner, whereby the systematic segment of the kth IR mother codeword carries a permuted copy of the kth IR data segment. The kth IR mother codeword may be shortened before being punctured and the puncturing of the kth IR mother codeword may remove a shortened segment of the kth IR mother codeword. The kth IR mother code is preferably a systematic polar code. The primary code is preferably one of a systematic polar code or a non-systematic polar code. The jth IR data segment may be smaller in size than a size of the input data packet for each $1 \le j \le (m-1)$, and wherein the ith IR data segment is distinct from the jth IR data segment for any pair of integers i and j such that $1 \le i < j \le (m-1)$, thereby ensuring that the IR codes are distinct from each other and from the primary code.

In another embodiment, a HARQ receiver apparatus for use in generating an output data packet as an estimate of an input data packet transmitted in a communications system employing a HARQ protocol in a HARQ session with a maximum received packet limit m, wherein the maximum received packet limit m is an integer greater than or equal to 2, includes: a receiver frontend configured to receive a received primary packet to produce a primary decoder input data; a HARQ decoder configured to process the primary decoder input data and generate a primary estimate of the input data packet; an error detector configured to detect errors in the primary estimate of the input data packet; and a feedback packet transmitter configured to transmit one of a positive acknowledgement (ACK) or a negative acknowledgement (NACK) depending on, respectively, whether the error detector detects an error in the primary estimate of the input data packet. The received primary packet carries a primary codeword from a primary code, wherein the primary codeword is a codeword in the primary code corresponding to an encoding of the input data packet. The receiver frontend is further configured, in response to the feedback packet transmitter transmitting (k−1) consecutive NACKs, to receive a kth received incremental redundancy (IR) packet to produce a kth IR decoder input data, wherein k is an integer value greater than or equal to 1 and less than or equal to (m−1). The HARQ decoder is further configured to process a kth collection of decoder input data and generate a kth IR estimate of the input data packet, wherein the kth collection of decoder input data comprise the primary decoder input data and the jth IR decoder input data for each integer j=1, 2, . . . , k. The error detector is further configured to detect errors in the kth IR estimate of the input data packet. The feedback packet transmitter is further configured to transmit one of a positive acknowledgement (ACK) or a negative acknowledgement (NACK) depending on, respectively, whether the error detector detects an error in the kth IR estimate of the input data packet. The kth received IR packet contains a kth IR codeword from a kth IR code, wherein the kth IR codeword is a punctured version of a kth IR mother codeword, wherein the kth IR mother codeword is a codeword from a kth IR mother code, wherein the kth IR mother codeword is the codeword in the kth IR mother code corresponding to a systematic encoding of a kth IR data segment, wherein the kth IR data segment is a subvector of the primary codeword, wherein the systematic encoding of the kth IR data segment comprises a mapping of the kth IR data segment to a systematic segment of the kth IR mother codeword, wherein the systematic segment of the kth IR mother codeword is a subvector of the kth IR mother codeword, and wherein the subvector of the kth IR mother codeword carries the kth IR data segment in a systematic manner. The punctured version of the kth IR mother codeword contains no elements from the systematic segment of the kth IR mother codeword. The HARQ session begins when the frontend receiver receives the received primary packet, and wherein the HARQ session ends when the feedback packet transmitter transmits a first ACK in the HARQ session or after the feedback packet transmitter transmits one of a first ACK in the HARQ session or an mth ACK/NACK signal in the HARQ session. The HARQ decoder may include a primary decoder and a collection of (m−1) IR decoders. The primary decoder may be a decoder configured to decode the primary code. The collection of (m−1) IR decoders may comprise, for each integer j=1, 2, . . . , (m−1), a jth IR decoder configured to decode the j IR mother code. For each integer k greater than or equal to 1 and less than or equal to (m−1), the kth IR estimate of the input data packet may be generated by a kth session of message passing among a kth collection of decoders, wherein the kth collection of decoders comprise the primary decoder and the jth IR decoder for each j=1, 2, . . . , k. For each integer k greater than or equal to 1 and less than or equal to (m−1), the kth session of message passing comprises (1+k) decoding steps, wherein the (1+k) decoding steps comprise a primary code decoding step and a jth IR code decoding step for each integer j=1, 2, . . . , k, wherein the (1+k) decoding steps are executed sequentially in reverse order, starting with the kth IR code decoding step, followed by the (k−1)th IR code decoding step, down to a first IR code decoding step, and ending with the primary code decoding step, wherein in the jth IR code decoding step the jth IR decoder decodes the jth IR mother code to generate an estimate of the jth IR data segment, wherein the messages available to the jth IR decoder in the jth IR code decoding step comprise the jth IR decoder input data, a jth segment of the primary decoder input data, and the estimate of the lth IR data segment for each l=j+1, . . . , k, wherein the jth segment of the primary decoder input data comprises a segment of the primary decoder input data corresponding to the jth IR data segment, wherein in the primary code decoding step the primary decoder decodes the primary code to generate the kth estimate of the input data packet, wherein in the primary code decoding step the messages available to the primary decoder comprise the primary decoder input data and the estimate of the lth IR data segment for each l=1, . . . , k. For each integer k greater than or equal to 1 and less than or equal to (m−1), the kth session of message passing may comprise belief propagation decoding, wherein in the kth session of message passing the kth collection of decoders exchange messages in an unrestricted manner. The kth IR mother code may be a systematic polar code. The primary code may be one of a systematic polar code or a non-systematic polar code. The jth IR data segment may be smaller in size than a size of the input data packet for each $1 \le j \le (m-1)$, and the ith IR data segment may be distinct from the jth IR data segment for any pair of integers i and j such that $1 \le i < j \le (m-1)$, thereby ensuring that the IR codes are distinct from each other and from the primary code.

Before undertaking the DETAILED DESCRIPTION below, it may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system or part thereof that controls at least one operation. Such a controller may be implemented in hardware or a combination of hardware together with either or both of software and/or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A; B; C; A and B; A and C; B and C; and A, B and C.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for other certain words and phrases are provided throughout this disclosure. Those of ordinary skill in the art should understand that in many if not most instances such definitions apply to prior as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 8 is a parameter list for a first embodiment of the HARQ transmitter in accordance with the present principles;

FIG. 9A is a design example exemplifying a preferred embodiment of the present principles;

DETAILED DESCRIPTION

Figure 1:
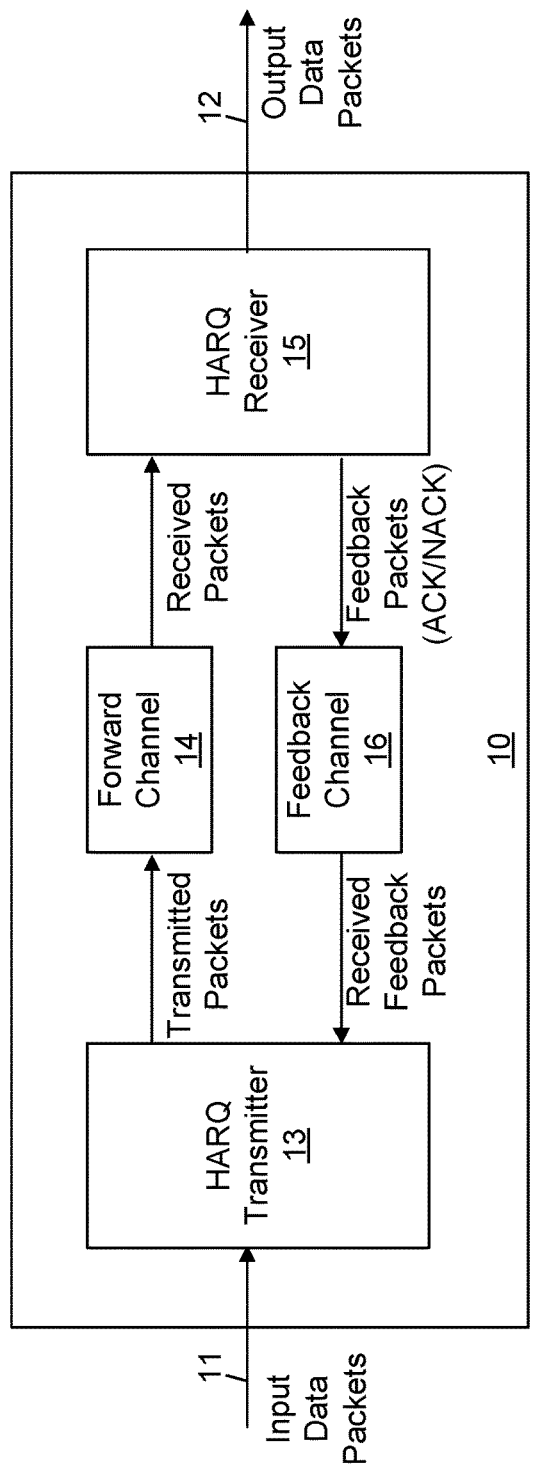
FIG. 1 is a functional block diagram of a HARQ system for data transmission over a communications channel in which the present principles may be employed.

FIGS. 1 through 12B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged communication system.

In accordance with established conventions in coding theory, data words and codewords in the system are represented herein as vectors over a finite field F. Field elements (scalars) are denoted by plain lower case letters, such as $a \in F$. Vectors are denoted by lower-case boldface letters, such as a and the notation $a \in F^N$ is used to indicate that a is an N-dimensional vector over a finite field F. The elements of a vector of length N are indexed with integers 1, 2, ..., N and a vector $a \in F^N$ is denoted in terms of its elements as $a=(a_1, a_2, \ldots, a_N)$. Matrices over a field are denoted by upper-case boldface letters, such as $A \in F^{M \times N}$, where M denotes the number of rows and N denotes the number of columns of A. A vector whose components are all zero (an all-zero vector) is denoted by 0.

A subvector of a given vector is specified by a selector set. A selector set for a vector $x=(x_1, x_2, \ldots, x_N)$ is defined as any subset A of the coordinate index set $\{1, 2, \ldots, N\}$ of x. The notation $x_A$ is used to denote the sub-vector $(x_{b_1}, x_{b_2}, \ldots, x_{b_n})$ where $\{b_1, b_2, \ldots, b_n\}$ is a listing of the elements of A in natural (increasing) order. For example, if $x=(5,6,7,8,9)$ and $A=\{4,1,2\}$, $x_A=(5,6,8)$. Thus, the subvector $x_A$ is uniquely defined regardless of the order of the elements of A. For any set A, the notation $|A|$ denotes the number of elements in A; the notation $A^c$ denotes the complement of A in a specified universal set. For any two sets A and B, the notation $A \backslash B$ denotes the set $A \cap B^c$.

The term "transform" (or, "transformation") is used below to refer to linear vector space operations over a finite field F. "Transform G" refers to a transform that is represented by a matrix G in a specific basis of the applicable vector space. A special type of transform that is important for polar coding is the polar transform $G=F^{\otimes n}$ over the binary field $F=\{0,1\}$, where $$F = \begin{bmatrix} 1 & 0 \\ 1 & 1 \end{bmatrix}$$

and $F^{\otimes n}$ is the nth Kronecker power of F.

In the following description, specific details such as particular embodiments, procedures, techniques, etc., are set forth for purposes of explanation, in order to provide a thorough understanding of the present principles, and not limitation. However, it will be apparent to one skilled in the art that the present principles may be practiced in other embodiments that depart from the specific details herein. For example, the present principles may be implemented in any data communications system between any data transmitter and data receiver, e.g., see FIG. 1. One specific, non-limiting application of the present principles is in a wireless communications system, e.g., see FIGS. 11 and 12A-12B.

In the following description, detailed descriptions of well-known protocols at the physical (PHY), medium access control (MAC), and higher layers (data link, network, transport, and application) are omitted so as not to obscure the description of the present principles with unnecessary detail. For example, the description does not mention that the transmitted packets in the HARQ system under consideration contain not only user data but also protocol data for such purposes as link control and packet identification. Furthermore, the following description disregards the possibility that the forward channel from the transmitter to the receiver may occasionally delay packets arbitrarily, lose them, or deliver them in a different order than they were sent. Another simplification in the following description is the assumption that the feedback channel from the receiver to the transmitter delivers the feedback packets (ACK/NACK) on time and without any errors. It is assumed that the communication system under consideration in this document is equipped with protocols to recover from packet delays, losses, etc. A similar assumption is made for the feedback channel. In actual systems, a HARQ transmitter expects to receive, for each packet it transmits, a feedback message within a certain time-out period. If the feedback does not arrive within the time-out period or arrives with errors, the HARQ transmitter 13 has to be equipped with error-recovery protocols that take corrective actions, such as sending an alert message to a higher layer protocol. Specification of error recovery protocols from the forward or feedback channels is omitted from the present disclosure in order to keep the focus on the novel aspects of the present disclosure. It will be apparent to one skilled in the art that the present principles can be applied together with any generic error-recovery protocol to recover from imperfections in the delivery of packets by the forward channel or the feedback channel.

Some of the figures contain individual function blocks without detailed explanation of the construction and operation of the hardware circuits used for their implementation. Whenever such details are omitted, it will be the case that those skilled in the art will be able to appreciate that the functions are implemented at least to some degree by hardware circuits, and may be implemented using individual hardware circuits, using software functioning in conjunction with a suitably programmed digital microprocessor or general purpose computer, using an application specific integrated circuit (ASIC), and/or using one or more digital signal processors (DSPs).

With the above in mind, initially referring to FIG. 1, a functional block diagram of a HARQ system 10 is shown. The HARQ system 10 executes a certain HARQ protocol (scheme) with the goal of reproducing input data packets 11 as output data packets 12 without any error. The HARQ system 10 comprises a HARQ transmitter 13, a forward channel 14, a HARQ receiver 15, and a feedback channel 16. The HARQ system 10 processes input data packets one by one, in separate HARQ sessions. In each HARQ session, the number of transmissions by the HARQ transmitter 13 is limited to a maximum number m, wherein m is a constant positive integer and is fixed as part of the design of the HARQ system 10. The maximum number m is common to both the HARQ transmitter 13 and the HARQ receiver 15. At the HARQ transmitter 13, the maximum number is referred to as a "maximum transmission limit m"; at the HARQ receiver 15, it is referred to as a "maximum received packet limit m". The first packet transmitted in the HARQ system 10 during a HARQ session is called a primary packet and the remaining packets are called IR packets. The number of IR packets in a session is limited to m−1.

The HARQ transmitter 13 is configured to transmit the primary packet and the IR packets one by one. The HARQ transmitter pauses to receive a feedback (ACK or NACK) from the HARQ receiver 15 between the packet transmissions. Each time the HARQ receiver 15 receives a new packet, it attempts to recover the input data packet using the information contained in all the packets received until then in the current HARQ session. The HARQ receiver 15 sends an ACK if the HARQ receiver 15 is able to produce an estimate of the input data packet that passes an error-detection test; otherwise, the HARQ receiver 15 sends a NACK. A HARQ session ends with success only if the HARQ transmitter 13 receives an ACK before receiving m consecutive NACKs within that HARQ session; otherwise, it ends with failure.

From an implementation viewpoint, the HARQ transmitter 13 and the HARQ receiver 15 are finite-state machines, interacting with each other by the signals they send to each other over the forward channel 14 and the feedback channel 16. The state of the HARQ transmitter 13 comprises a transmission counter, wherein the transmission counter keeps track of the number of packets transmitted in the current HARQ session. When the value of the transmission counter reaches the maximum transmission limit m, the HARQ transmitter 13 cannot continue sending any more packets in the current HARQ session; and the session must terminate. Likewise, the state of the HARQ receiver 15 comprises a received packet counter, wherein the received packet counter counts the number of packets received in the current HARQ session and its value cannot exceed the maximum received packet limit m.

Figure 2:
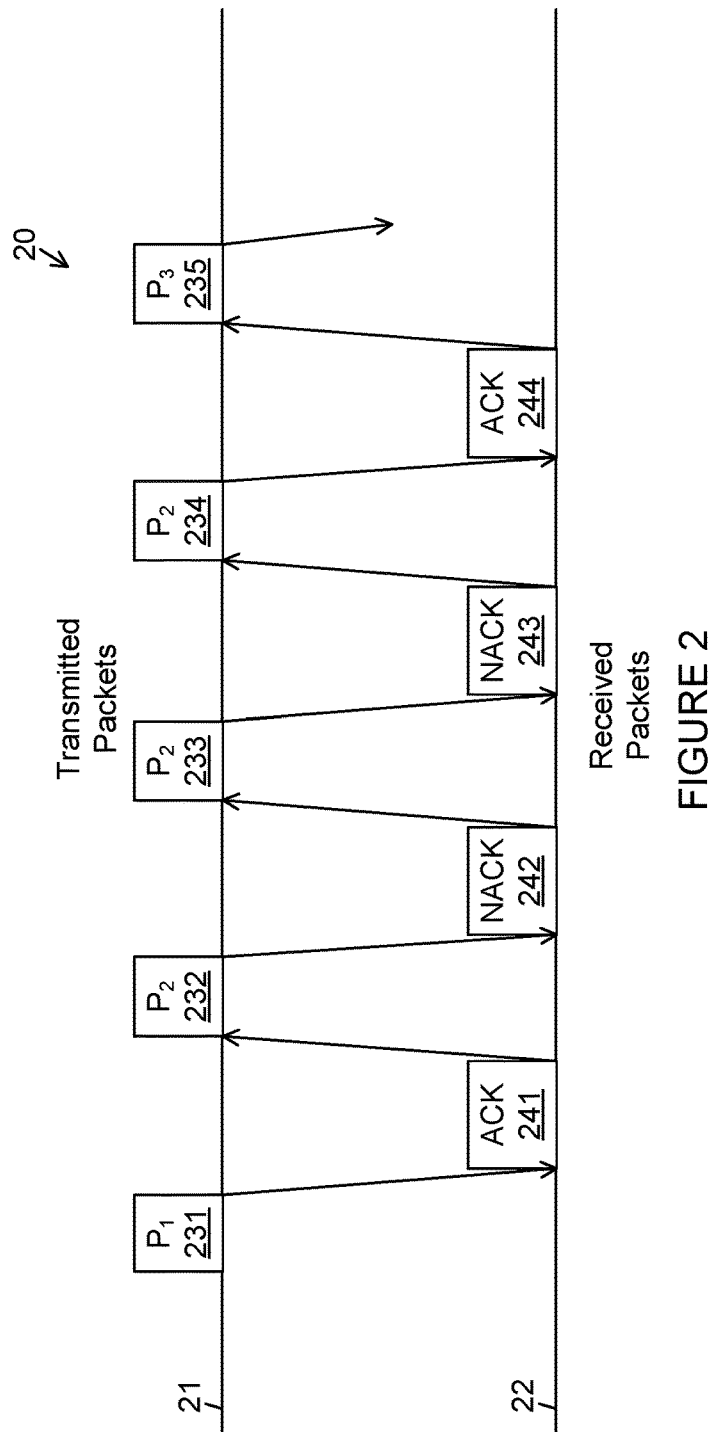
FIG. 2 is a diagram of a CC-HARQ scheme that sends an identical copy of the primary packet each time a NACK is received.

Turning to FIG. 2, a CC-HARQ scheme 20 is shown as a special instance of the general HARQ framework of FIG. 1. In FIG. 2, a first horizontal line 21 depicts the events at the HARQ transmitter 13 and a second horizontal line 22 depicts the events at the HARQ receiver 15. An arrow from the first horizontal line 21 to the second horizontal line 22 represents a transmission of a packet over the forward channel 14 from the HARQ transmitter 13 to the HARQ receiver 15. An arrow from the second horizontal line 22 to the first horizontal line 21 represents a transmission of a feedback packet over the feedback channel 16 from the HARQ receiver 15 to the HARQ transmitter 13. The CC-HARQ scheme 20 uses a simple retransmission method, in which all packets transmitted in a HARQ session are identical copies of the primary packet in that session. In the specific scenario depicted in FIG. 2, a first HARQ session begins with the HARQ transmitter 13 sending a first primary packet $P_1$ 231 over the forward channel 14, wherein the first primary packet 231 contains a first primary codeword, wherein the first primary codeword is a codeword in a primary code, and the first primary codeword is generated from a first input data packet by a primary encoder, and wherein the primary encoder is an encoder for the primary code. The HARQ transmitter 13 generates the first primary codeword by encoding the first input data packet in accordance with the encoding rules of a first primary code. The HARQ receiver 15 receives a noisy copy of the primary packet 231, decodes the noisy copy of the first primary packet 231 successfully, recovers the first input data packet, and sends a first ACK 241 over the feedback channel 16. Upon receiving the first ACK 241, the HARQ transmitter 13 releases the first input data packet, generates a second primary packet $P_2$ 232 by encoding a second input data packet, and sends the second primary packet $P_2$ 232 over the forward channel 14. In the particular scenario in FIG. 2, the HARQ receiver 15 fails to recover the second input data packet from a noisy copy of the second primary packet 232 and sends a NACK 242 over the feedback channel 16. The HARQ transmitter 13 receives the NACK 242 and transmits a first IR packet $P_2$ 233, wherein the first IR packet is an identical copy of the second primary packet $P_2$ 232. The HARQ receiver 15 receives a noisy copy of the first IR packet $P_2$ 233 and attempts to recover the second input data packet by decoding jointly the noisy copies of the second primary packet 232 and the first IR packet 233. In the scenario in FIG. 2, this decoding attempt ends in failure and the HARQ receiver 15 sends a second NACK 243. The HARQ transmitter 13 responds to the second NACK 243 by transmitting a second IR packet $P_2$ 234, wherein the second IR packet $P_2$ 234 is an identical copy of the second primary packet $P_2$ 232. Following the reception of a noisy copy of the second IR packet $P_2$ 234, the HARQ receiver 15 makes a third attempt at decoding the second input data packet, this time by processing jointly the noisy copies of the packets 232, 233, and 234. The third attempt is successful and the HARQ receiver 15 sends an ACK 244. The reception of the ACK 244 by the HARQ transmitter 13 marks the end of the second HARQ session. A third HARQ session begins with the HARQ transmitter 13 proceeding to encode a third input data packet and sending a third primary packet $P_3$ 235. This completes the description of FIG. 2. The CC-HARQ scheme has the advantage of being simple and will be used below as a benchmark to measure the performance of a preferred embodiment of the present principles.

Figure 3:
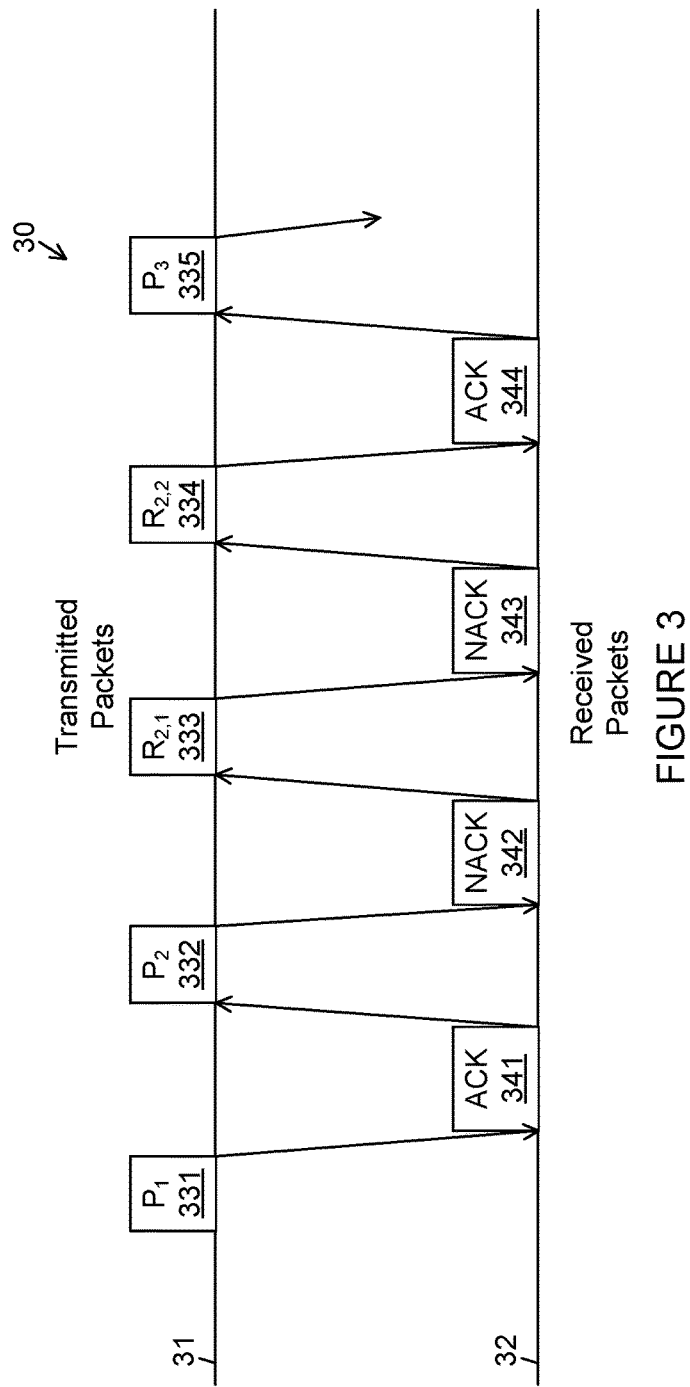
FIG. 3 is a diagram of an IR-HARQ scheme within which the transmitter sends an IR packet each time it receives a NACK, where each IR packet may be different from the primary packet and from each other.

FIG. 3 shows an example HARQ scheme 30, wherein the HARQ scheme 30 generates IR packets in accordance with the general framework described with reference to FIG. 1. The example in FIG. 3 differs from the CC-HARQ example in FIG. 2 only in the way the IR packets are generated. The IR packets in FIG. 3 are not constrained to be identical copies of a primary packet; they can be generated in accordance with any specific encoding rule. The example in FIG. 3 begins with the HARQ transmitter 13 sending a first primary packet 331. The HARQ receiver 15 receives a noisy copy of the first primary packet 331, successfully recovers the first input data packet, and sends a first ACK 341. The HARQ transmitter 13 sends a second primary packet $P_2$ 332. The HARQ receiver 15 fails to recover the second input data packet from a received noisy copy of the second primary packet $P_2$ 332, and sends a NACK 342. The HARQ transmitter 13 receives the NACK 342 and transmits a first IR packet $R_{2,1}$ 333, wherein the first IR packet 333 is derived from the second input data packet. The HARQ receiver 16 receives a noisy copy of the first IR packet $R_{2,1}$ 333, fails to decode the second input data packet from the received packets 332 and 333, and sends a second NACK 343. The HARQ transmitter 13 responds to the second NACK 343 by transmitting a second IR packet $R_{2,2}$ 334, wherein the second IR packet 334 is derived from the second primary packet 332. The HARQ receiver 15 makes a third attempt at recovering the second input data packet from the received packets 332, 333, and 334. The third attempt is successful and the HARQ receiver 15 sends an ACK 344. The reception of the ACK 344 by the HARQ transmitter 13 marks the end of the second HARQ session in the example. A third HARQ session begins with the HARQ transmitter 13 sending a third primary packet $P_3$ 335. This example is representative of a general IR-HARQ scheme in which the HARQ transmitter may use any encoding rule to generate the IR packets. The present principles follow the general framework of FIG. 3.

Figure 4:
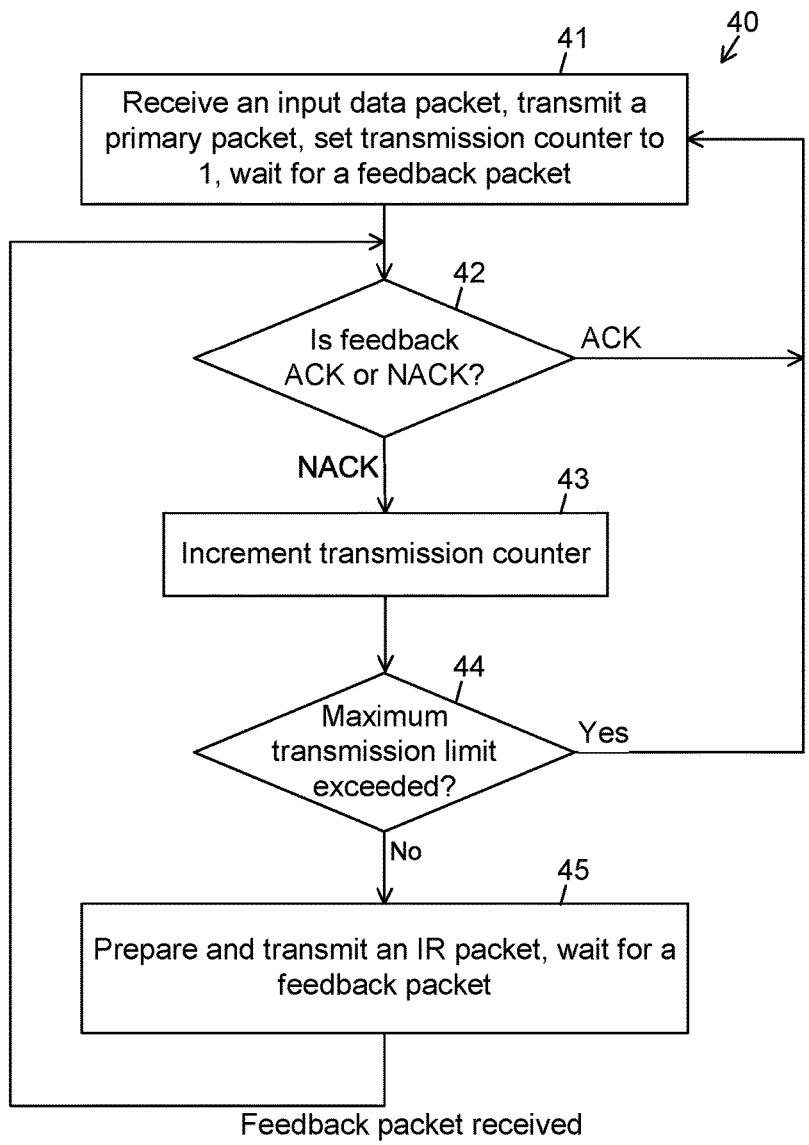
FIG. 4 is a flowchart diagram illustrating the procedure of one example implementation of a HARQ transmitter within which the present principles may be applied.
Figure 5:
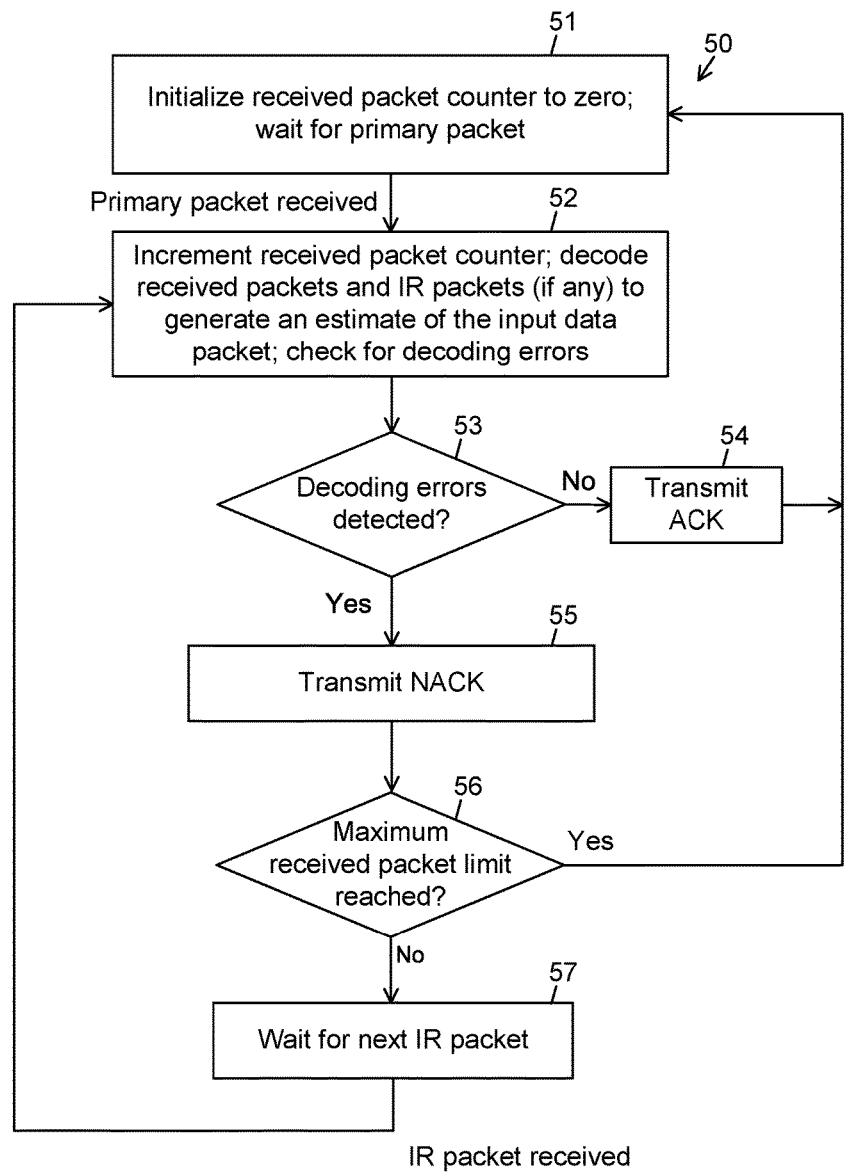
FIG. 5 is a flowchart diagram illustrating the procedure of one example implementation of a HARQ receiver within which the present principles may be applied.

FIGS. 4 and 5, respectively, show in flowchart format a HARQ transmitter 40 and a HARQ receiver 50. The flowcharts in FIGS. 4 and 5 specify the general framework of the present principles with greater precision. At the start of each HARQ session, the HARQ transmitter 40 is in a primary packet state 41, wherein the primary packet state comprises the operations of waiting for an input data packet, receiving the input data packet, encoding the input data packet into a primary codeword, transmitting the primary codeword in a primary packet, setting a transmission counter to 1, and waiting for a feedback in response to the primary packet. When the HARQ transmitter 40 receives the feedback in response to the primary packet, the state of the HARQ transmitter 40 changes to a feedback check state 42, wherein the feedback check state 42 comprises checking if the feedback is an ACK or a NACK. If the feedback is an ACK, the state of the HARQ transmitter 40 changes to the primary packet state 41, whereby a current HARQ session ends with success and a next HARQ session begins. If the feedback is a NACK, the state of the HARQ transmitter 40 changes to a transmission counter state 43, wherein the transmission counter state 43 comprises incrementing the transmission counter value by one. The next state of the HARQ transmitter 40 is a transmitter counter check state 44, wherein the transmitter counter check state 44 comprises checking whether the transmission counter value exceeds a maximum transmission limit. The maximum transmission limit is a design parameter for the HARQ system and determines the maximum number of packet transmissions (primary packet plus IR packets) that can take place in a HARQ session. If the transmission counter exceeds the maximum transmission limit, the HARQ transmitter 40 moves to the primary packet state 41, whereby a current HARQ session ends with a failure and a new HARQ session begins. If the transmission counter does not exceed the maximum transmission limit, the HARQ transmitter 40 moves to an IR state 45, wherein the IR state 45 comprises the steps of preparing an IR codeword, transmitting the IR codeword in an IR packet, and waiting for a feedback in response to the transmitted IR packet. When the feedback in response to the transmitted IR packet arrives, the HARQ transmitter moves to the feedback check state 42. The cycle of operations at the HARQ transmitter 40 continues in accordance with the above description. This completes the description of the flowchart in FIG. 4.

At the start of each HARQ session, the HARQ receiver 50 is in a receiver primary packet state 51, wherein the receiver primary packet state 51 comprises the operations of initializing a received packet counter to 0 and waiting for a primary packet. When the HARQ receiver 50 receives the primary packet, the state of the HARQ receiver 50 changes to a decoding state 52. In the decoding state 52, the HARQ receiver 50 attempts to decode the input data packet by using the information available in all received packets in the current HARQ session (the received primary packet and any received IR packets). The operation in the decoding state 52 is completed by the generation of an estimate of the input data packet. The next state after the decoding state 52 is an error detection state 53, wherein the error detection state 53 comprises checking if the estimate of the input data packet contains any errors. If no errors are detected in the estimate of the input data packet, the HARQ receiver 50 moves to an ACK state 54. In the ACK state 54, the HARQ receiver 50 transmits an ACK and moves to the receiver primary packet state 51, whereby a HARQ session is completed with success. If the HARQ receiver 50 detects errors in the error detection state 53, the HARQ receiver 50 moves to a NACK state 55. In the NACK state 55, the HARQ receiver 50 transmits a NACK, increments the received packet counter by one, and moves to the receiver counter check state 56. In the receiver counter check state 56, the HARQ receiver 50 checks if the receiver packet counter equals a maximum received packet limit. The maximum received packet limit is a parameter whose value is set to the same number as the maximum transmission limit at the HARQ transmitter 40 in the HARQ system. If the result of the check in state 56 is YES, the HARQ receiver 50 moves to the receiver primary packet state 51, whereby the current HARQ session is completed with failure and a new HARQ session begins. If the received packet counter is smaller than the maximum received packet limit, the HARQ receiver 50 moves to an IR packet waiting state 57. In the IR packet waiting state, the HARQ receiver 50 waits until a new IR packet is received; and, upon receiving the new IR packet, it moves to the decoding state 52. The HARQ session at the HARQ receiver 50 continues until either the HARQ receiver 50 generates an estimate of the input data packet that passes the error detection test, or the number of received packets reaches the maximum received packet limit.

Figure 6:
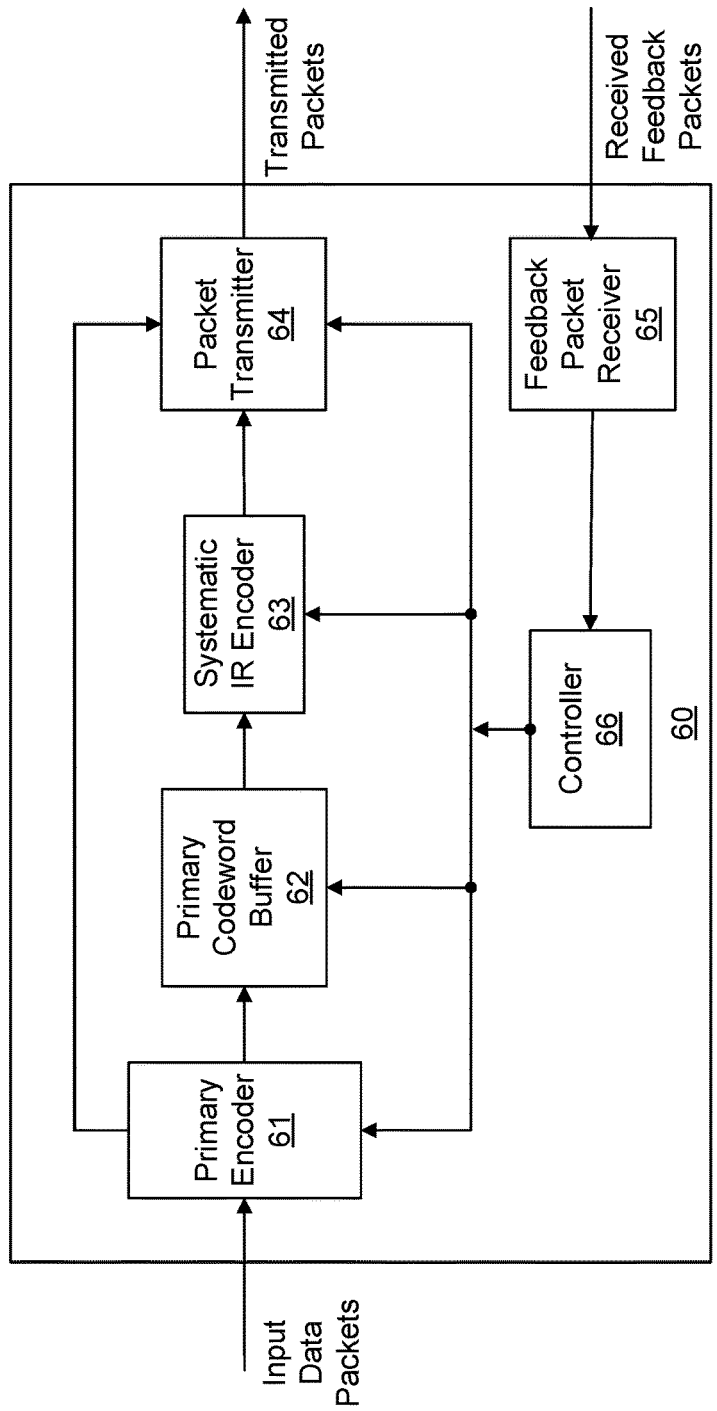
FIG. 6 a is a more detailed functional block diagram of an example HARQ transmitter.
Figure 7:
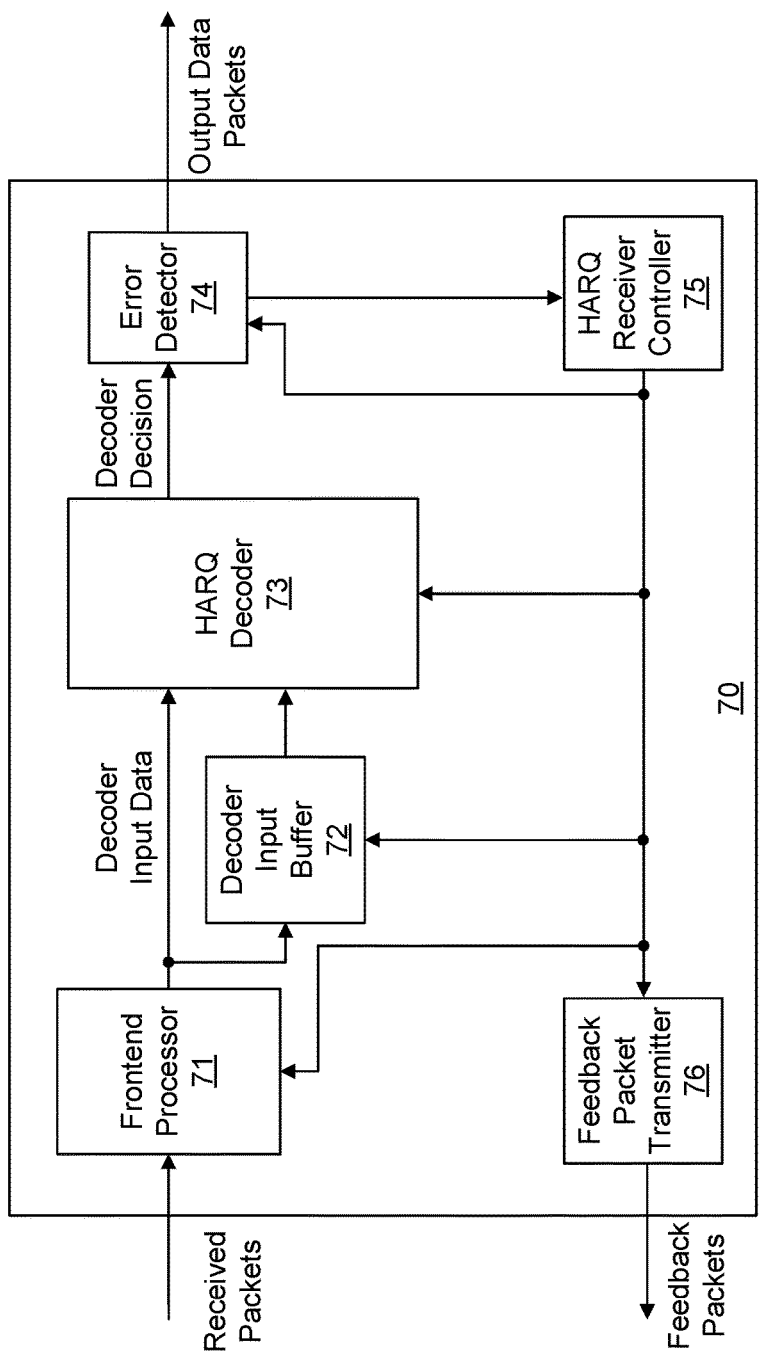
FIG. 7 is a more detailed functional block diagram of an example HARQ receiver.

FIGS. 6 and 7, respectively, show in functional block diagram format a HARQ transmitter 60 and a HARQ receiver 70. The functional block diagrams in FIGS. 6 and 7 illustrate with greater specificity the hardware implementation aspects the present principles. The description below relates to a single HARQ session consisting of the transmission of a primary packet and a maximum of (m−1) additional IR packets. The HARQ transmitter 60 is a finite-state machine, wherein the state of the machine is controlled by a controller 66, and the state comprises a transmission counter. The state of the HARQ transmitter 60 is initialized to an initial state at the beginning of the HARQ session. The HARQ transmitter 60 further comprises a primary encoder 61, wherein the primary encoder in the initial state waits for an input data packet, receives an input data packet when it becomes available, encodes the input data packet into a primary codeword, saves the primary codeword in a primary codeword buffer 62, and provides the primary codeword as input to a packet transmitter 64. The packet transmitter 64 transmits the primary codeword in a primary packet over a forward channel. Following the transmission of the primary packet, the HARQ transmitter 60 sets the value of the transmission counter to 1 and starts waiting for a first feedback packet from the HARQ receiver, wherein the waiting ends when the first feedback packet arrives at a feedback packet receiver 65. The feedback packet receiver 65 extracts a first feedback signal from the first feedback packet and passes the feedback signal to the controller 66. The first feedback signal is either an ACK or a NACK. If the first feedback signal is an ACK, the controller 66 resets the state of the HARQ system to the initial state and instructs the primary encoder to receive and encode a new input data packet. If the first feedback signal is a NACK and the transmission counter is smaller than a maximum transmission limit m, the controller 66 increments the transmission counter by one and sends a first IR transmission instruction to a systematic IR encoder 63. Upon receiving the first IR transmission instruction, the systematic IR encoder 63 fetches from the primary codeword buffer 62 a first segment of the primary codeword, encodes the first segment of the primary codeword in a systematic manner into a first IR codeword from a first IR code, and presents the first IR codeword to the packet transmitter 64. The packet transmitter 64 transmits the first IR codeword in a first IR packet over the forward channel. Following the transmission of the first IR packet, the HARQ transmitter starts waiting for a second feedback packet. The waiting ends when the feedback receiver 65 receives the second feedback packet. The feedback receiver 65 extracts a second feedback signal from the second feedback packet and passes it to the controller 66. If the second feedback signal is an ACK, the controller 66 resets the state of the HARQ transmitter to the initial state and instructs the primary encoder to receive and encode a new input data packet. If the second feedback signal is a NACK and the transmission counter is smaller than the maximum transmission limit m, the controller 66 increments the transmission counter by one (to 3) and sends a second IR transmission instruction to the systematic IR encoder 63. Upon receiving the second IR transmission instruction, the systematic IR encoder 63 fetches a second segment of the primary codeword from the primary codeword buffer 62, encodes the second segment of the primary codeword in a systematic manner into a second IR codeword from a second IR code, and presents the second IR codeword to the packet transmitter 64. The packet transmitter 64 transmits the second IR codeword in a second IR packet. Following the transmission of the second IR packet, the HARQ transmitter starts waiting for a third feedback packet. The waiting ends when the feedback receiver 65 receives the third feedback packet. Depending on the value of the third feedback signal, the HARQ session continues in a manner similar to the first two IR rounds described above. In any case, a HARQ session ends with failure as soon as the number of NACK signals received by the HARQ transmitter 60 in the HARQ session reaches the maximum transmission limit m. A HARQ session ends with success if the HARQ transmitter 60 receives an ACK before receiving m NACKs in the HARQ session.

FIG. 7 depicts a HARQ receiver 70 configured for use together with the HARQ transmitter 60 of FIG. 6. The description below relates to a single HARQ session consisting of the reception of a primary packet and a maximum of (m−1) additional IR packets that are associated with the primary packet. The HARQ receiver 70 is a finite-state machine, wherein the state of the machine is controlled by a HARQ receiver controller 75. The state of the HARQ receiver 70 is initialized to an initial state at the beginning of the HARQ session. The state of the HARQ receiver 70 comprises a received packet counter, wherein the value of the received packet counter is set to zero upon entry into the initial state and incremented by one each time a new packet is received by the HARQ receiver 70. The overall goal of the HARQ receiver 70 in each HARQ session is to recover an input data packet and deliver it as an output data packet. The HARQ receiver 70 attempts to recover the input data packet by using the information in the received packets, wherein the received packets comprise a primary received packet and up to (m−1) additional received IR packets. The HARQ receiver 70 comprises a frontend processor 71, wherein the frontend processor 71 processes received packets and produces a decoder input data from each received packet. The decoder input generated from a received packet contains statistical information about a codeword carried by the received packet, wherein the statistical information is typically a vector of fixed-precision real numbers, wherein each fixed-precision real number is a log-likelihood ratio for a particular bit of the codeword carried by the received packet. The decoder input data is stored in a decoder input buffer 72, wherein the decoder input buffer 72 is a memory device for holding the decoder input data so that it can be used as needed during the HARQ session. The HARQ receiver further comprises a HARQ decoder 73, wherein the HARQ decoder is a decoder configured to decode the input data packet using the current decoder input data from the frontend processor 71 as well as previous decoder input data belonging to previous packets received in the current HARQ session and stored in the decoder input buffer 72. After each decoding attempt, the HARQ decoder 73 passes a decoder decision to an error detector 74, wherein the decoder decision is an estimate of the input data packet. The error detector 74 applies an error detection test on the decoder decision with the goal of detecting errors in the decoder decision. If the error detector 74 detects no errors in the decoder decision, the HARQ receiver 70 accepts the decoder decision and sends the decoder decision out as an output data packet. The output data packet is ideally an error-free replica of the input data packet; however, undetected errors may be present in the decoder output packet. If the error detector 74 detects any errors in the decoder decision, no output data packet is sent out. Regardless of the error detection test result, the error detector 74 sends the error detection test result to the HARQ receiver controller 75. The error detection test result is typically a binary-valued result, indicating whether or not an error was detected in the decoder decision. The HARQ receiver controller 75 controls the flow of operations in the HARQ receiver. In particular, the HARQ receiver controller 75 controls a feedback packet transmitter 76, wherein the feedback packet transmitter 76 is a transmitter that transmits feedback packets over a feedback channel to the HARQ transmitter 60 in the HARQ system. If the error detection test result is positive (indicating that errors were detected in the decoder decision), the HARQ receiver controller 75 instructs the feedback packet transmitter to send a NACK; if the error detector test result indicates that no errors were detected in the decoder decision, the HARQ receiver controller 75 instructs the feedback packet transmitter to send an ACK. The HARQ receiver controller initializes all functional blocks of the HARQ receiver 70 to their initial states if the error detection test result indicates no errors in the decoder decision or the received packet counter reaches a maximum received packet limit m. Upon returning to the initial state, the HARQ receiver 70 continues its operation by executing a new HARQ session, in accordance with the same rules described above. This completes the description of the HARQ receiver 70. Jointly, the HARQ transmitter 60 and the HARQ receiver 70 exemplify the operational details of a HARQ system 10 as described above with reference to FIG. 1. The maximum transmission limit at the HARQ transmitter 60 and the maximum received packet limit at the HARQ receiver are configured to be equal to a common value m, wherein m is an integer greater than or equal to 2.

FIG. 8 shows a HARQ transmitter parameter list 80 for a first embodiment of the HARQ transmitter 60 in accordance with the present principles. The HARQ transmitter parameter list 80 comprises a primary list 81 and an IR list 82. The primary list 81 defines the parameters of the primary encoder 61 and includes a pair of length parameters (N, K) and a generator matrix G. The first length parameter N is the length of the primary codeword $x=(x_1, x_2, \ldots, x_N)$ and the second length parameter K is the length of the input data packet $d=(d_1, d_2, \ldots, d_K)$. The primary encoder 61 encodes the input data packet d into the primary codeword x from a primary code in accordance with the equation x=dG. The primary code in the first embodiment of the HARQ transmitter can be chosen in any desired manner.

Before proceeding with a detailed description of the first embodiment, it should be observed that the first embodiment as described above is general enough to admit a generator matrix G that incorporates a Cyclic Redundancy Check (CRC) generator for error detection purposes. For instance, error detection can be built into the system by having a generator matrix G of the form $G=G_1G_2$, where $G_1$ is a CRC generator matrix and $G_2$ is a generator matrix for an error correcting code. In this case, the encoding operation comprises two stages. The first stage comprises the computation $dG_1=(d, c)$ which appends a CRC c to the data d. In the second stage, the primary codeword is obtained as $x=(d, c)G_2$. When a CRC is inserted in the manner described here, the decoding operation at the HARQ receiver will usually comprise two stages, wherein the first stage generates at least one estimate $(\hat{d}, \hat{c})$ of (d, c), and the second stage checks if $\hat{d}G_1=(\hat{d}, \hat{c})$ holds for each estimate generated in the first stage. If no estimate $(\hat{d}, \hat{c})$ satisfies the CRC check, the HARQ receiver sends a NACK; if at least one estimate $(\hat{d}, \hat{c})$ is found that satisfies the CRC check, the HARQ receiver accepts one of the valid estimates as a final decision and sends an ACK. The description of the first embodiment given here omits showing how error detection is carried out in order not to clutter the description with unnecessary generic detail. It will be clear to one skilled in the art that any standard error detection method can be employed in conjunction with the present principles.

The IR list 82 defines the parameters of the systematic IR encoder 63, which is configured to generate a sequence of (m−1) IR codewords from respective IR codes. The IR codewords and the associated variables are indexed by an integer k that takes values in the range 1≤k≤(m−1). The kth IR codeword is denoted by $r^{(k)}$ and is obtained from a kth IR mother codeword $x^{(k)}$ by a shortening and puncturing operation. The terms "puncturing" and "shortening" are used here in the usual technical sense they are used in the error-correction coding literature. Puncturing a code C refers to the operation of not transmitting certain coordinates as selected by a punctured segment P. For example, given a code C with codewords of length N=8 and a punctured segment P={1,3,8}, the puncturing operation applied to $(x_1, x_2, \ldots, x_8) \in C$ produces $(x_2, x_4, x_5, x_6, x_7)$.

Shortening of a code C defines a subcode $C' \subset C$ by placing constraints on the codewords of C. For example, for a code C and a shortened segment S, a shortened code is defined as $C'=\{x \in C: x_S=c\}$, wherein c is a constant bit pattern of size $|S|$. Since the coordinates in S are fixed, they carry no information. In the following, shortening operations will be applied with the constant vector c equal to an all-zero vector. The shortened part $x_S$ of a codeword carries no information; in the following, the shortened parts will be punctured before transmission.

The kth IR codeword $r^{(k)}$ is a codeword in a kth IR code and the kth IR mother codeword $x^{(k)}$ is a codeword in a kth IR mother code. The IR list 82 displays a collection of parameters ($N_k, K_k, S_k, M_k, A_k, V_k, T_k$) that characterize the kth IR code and the kth IR mother code.

Three of the parameters in the IR list 82 are length parameters. A parameter $N_k$ is an integer, specifying the length of the kth IR codeword $r^{(k)} = (r_1^{(k)}, r_2^{(k)}, \ldots, r_{N_k}^{(k)})$. A parameter $K_k$ is an integer, specifying the size of the data payload of the kth IR mother codeword $x^{(k)}$. A parameter $M_k$ is an integer, specifying the length of the kth IR mother codeword $x^{(k)} = (x_1^{(k)}, x_2^{(k)}, \ldots, x_{M_k}^{(k)})$. It follows from the definition of the length parameters that the rate of the kth IR code is $K_k/N_k$ and the rate of that the kth IR mother code is $K_k/M_k$.

The remaining parameters in the IR list 82 are selector sets. A kth IR data selector $S_k$ is a selector set for selecting a kth primary codeword segment $x_{S_k}$, wherein the kth primary codeword segment $x_{S_k}$ is the part of the primary codeword x that is used to generate the kth IR mother codeword $x^{(k)}$. A kth systematic segment $A_k$ is a selector set for selecting a kth systematic segment $x_{A_k}^{(k)}$, wherein the kth systematic segment $x_{A_k}^{(k)}$ is the part of the kth IR mother codeword $x^{(k)}$ that carries the kth primary codeword segment $x_{S_k}$. A kth shortened segment selector $V_k$ is a selector set for selecting a kth shortened segment $x_{V_k}^{(k)}$, wherein the kth shortened segment $x_{V_k}^{(k)}$ is the part of the kth mother codeword $x^{(k)}$ that is shortened in the sense defined above. A kth punctured segment selector $T_k$ is a selector set for selecting a kth punctured segment $x_{T_k}^{(k)}$, wherein the kth punctured segment $x_{T_k}^{(k)}$ is the part of the kth IR mother codeword $x^{(k)}$ that is punctured in the sense defined above. The systematic IR encoder 63 is configured to encode the kth primary codeword segment $x_{S_k}$ into the kth IR mother codeword $x^{(k)}$ so that $x_{A_k}^{(k)} = x_{S_k}$ and $x_{V_k}^{(k)} = 0$, thereby ensuring that the encoding operation is systematic and the kth IR mother codeword $x^{(k)}$ carries no information in the kth shortened segment $x_{V_k}^{(k)}$. The systematic IR encoder 63 obtains the kth IR codeword $r^{(k)}$ by puncturing the kth IR mother codeword $x^{(k)}$ and setting $$r^{(x)} = x_{T_k^c}^{(k)},$$

where $T_k^c$ is the complement of the kth punctured segment $T_k$.

The IR list 82 specifies a number of constraints on the selector sets. Some of these constraints require explanation. The constraint $|S_k|=K_k$ and $|A_k|=|S_k|$ ensure that the kth primary codeword segment $X_{S_k}$ can be carried in the kth systematic segment $x_{A_k}^{(k)}$. The constraint that $A_k$ and $V_k$ are disjoint is necessary because $x_{A_k}^{(k)}$ must be able to vary with $x_{S_k}$ while $x_{V_k}^{(k)}$ has to remain fixed. The constraint $K_k < K$ ensures that the kth IR code and the primary code are different codes, thereby leaving simple repetition (as in CC-HARQ) outside the domain of the present principles. Finally, the constraint that the segment selector sets $S_1, S_2, \ldots, S_{m-1}$ are pairwise distinct ensures that no two of the IR codewords $r^{(1)}, r^{(2)}, \ldots, r^{(m-1)}$ carry the same data payload, thereby ensuring that simple repetition (as in CC-HARQ) is avoided in the generation of IR codewords. Thus, the present principles ensure that the primary codeword and the (m−1) IR codewords carry distinct data payloads. This completes the description of the first embodiment.

The first embodiment provides a broad framework for implementing a HARQ system in accordance with the present principles. In the following, more specific embodiments that refine the first embodiment are considered. To motivate these more specific embodiments, a number of points regarding the first embodiment need further clarification and discussion. Although not stated as a requirement in the IR list 82, it is preferable to choose the punctured segment $T_k$ so that $V_k \subset T_k$. This ensures that the coordinates $x_{V_k}^{(k)}$ which are fixed to 0 are punctured and not transmitted unnecessarily over the forward channel. The first embodiment does not specify how $T_k$ is to be chosen. It is preferable to take $T_k \supset A_k \cup V_k$. The reason for having $V_k \subset T_k$ has already been explained above. Having $A_k \subset T_k$ ensures that the kth segment $x_{S_k}$ of the primary codeword is excluded from retransmission as part of the kth IR codeword $x^{(k)}$. The rationale here is that the HARQ receiver in the system has already received a noisy copy of $x_{S_k}$ as part of received primary packet. Information theory teaches that the forward channel capacity is used in a more efficient manner if, instead of repeating $x_{S_k}$, the kth IR codeword $r^{(k)}$ carries new parity bits derived from $x_{S_k}$. Motivated by this, a preferred embodiment of the present principles given below takes $T_k = A_k \cup V_k$, thereby dropping $x_{S_k}$ entirely in favor of new parity bits. The choice $T_k = A_k \cup V_k$ differentiates the present principles from simple repetition techniques such as CC-HARQ. In CC-HARQ, diversity is provided by simple retransmission of previously transmitted bits; the present principles avoid simple retransmission so as to obtain more effective utilization of channel resources. The performance gain of the present principles over CC-HARQ is illustrated by an example later in the following.

The first embodiment does not specify the type of the primary code. In fact, the present principles can be applied with any arbitrary type of primary code. The primary code can be systematic or non-systematic; it may be a polar code or any other type of code. The primary code may have been obtained by shortening or puncturing of a longer code. The primary code may incorporate a CRC for error detection purposes. This flexibility in the choice of the primary code ensures that the present principles can be applied to provide an add-on HARQ capability to any existing FEC system. In a preferred embodiment of the present principles, described below, the primary code is a non-systematic polar code, and the systematic IR codes are systematic polar codes. The restriction of the primary code in the example to a non-systematic code is solely for purposes of giving a specific example, and not a limitation of the present principles. The present principles can be used with systematic primary codes.

In the first embodiment, the systematic IR encoder 61 is configured so that $x_{A_k}^{(k)} = x_{S_k}$. It may be possible to improve the HARQ system performance by permuting the coordinates of $x_{S_k}$ before embedding them in the kth IR mother codeword. It is foreseen that, in some embodiments of the present principles, the systematic IR encoder 63 will apply an embedding operation of the form $x_{A_k}^{(k)} = \pi(x_{S_k})$, where $\pi$ is a permutation that changes the order of the elements of $x_{S_k}$ but not their values. If the segment $x_{S_k}$ is affected by a burst of noise during the transmission of the primary codeword, then applying a permutation on $x_{S_k}$ before IR encoding disperses the burst of noise and presents the IR decoders with a temporally more uniform distribution of noise. This may improve the HARQ system performance (throughput and reliability).

The first embodiment places no constraints on the type of the IR codes, other than requiring them to be systematic. In a preferred embodiment of the present principles, described below, the IR codes are taken as systematic polar codes. The present principles primarily target applications wherein the IR codes are systematic polar codes.

A preferred embodiment of the present principles is presented next. For simplicity of exposition, the preferred embodiment is presented with the primary encoder 61 being a non-systematic polar encoder with no shortening and no puncturing. Accordingly, the block length N for the primary encoder is a power of two, that is, $N=2^n$ for some integer $n \geq 1$. The active segment A for the primary code is determined by using any standard method of polar code construction. Once the active segment A is determined, a recommended method of implementing the primary encoder 61 is to use a standard non-systematic polar encoder. Such an encoder first embeds the input data packet $d=(d_1, d_2, \ldots, d_K)$ into a source word $u=(u_1, u_2, \ldots, u_N)$ by setting $u_A=d$; next, the encoder fills in the complementary set of coordinates with zeros (or any other fixed pattern of bits) by setting $u_{A^c}=0$, and then computes the primary codeword $x=(x_1, x_2, \ldots, x_N)$ by carrying out the transform operation $x=uG_N$, where $G_N=F^{\otimes n}$ with $$F = \begin{bmatrix} 1 & 0 \\ 1 & 1 \end{bmatrix}.$$

It is well known that the transform operation $x=uG_N$ can be carried out within O(N log N) binary logic operations. This completes the description of the preferred embodiment of the primary encoder 61.

A preferred embodiment of the systematic IR encoder 63 follows. First, the design details of the kth IR code are described. The relevant parameters for the design of the kth IR code are listed in the IR list 82 of FIG. 8. In the preferred embodiment, the IR mother codes are systematic polar codes. The length $M_k$ of the kth IR mother code is chosen as the smallest integral power of two that is greater than or equal to $N_k+K_k$, that is, $M_k=2^i$ for the unique value of i such that $2^{i-1}<N_k+K_k\leq2^i$. The kth systematic segment selector $A_k$ is obtained in three steps. First, a standard systematic polar code design method is used to obtain a reliability-ordered list of the coordinates $\{1, 2, \ldots, M_k\}$ of the kth IR mother code. Second, the coordinates in the kth shortened segment selector $V_k$ are removed from the reliability-ordered list to obtain a shortened list of size $N_k+K_k$. Third, the most reliable $|S_k|$ elements of the reliability-ordered list are chosen to form the kth systematic segment selector $A_k$. This method can be applied regardless of how the kth shortened segment selector $V_k$ is chosen. To be specific, the embodiment here uses $V_k=\{i: N_k+K_k+1\leq i\leq M_k\}$ as the kth shortened segment selector $V_k$; however, this choice is for demonstration only. Given specific choices for the kth shortened segment selector $V_k$ and the kth systematic segment selector $A_k$, the preferred embodiment of the kth punctured segment selector $T_k$ is $T_k=A_k \cup V_k$. It is noted that the construction method for the selector sets as specified here ensures that the constraint $A_k \cap V_k=\emptyset$ in the IR list 82 is automatically satisfied. This completes the description of the kth IR code in the preferred embodiment.

Turning attention to the operation of the systematic IR encoder 63, the systematic IR encoder 63 in the preferred embodiment follows the same generic steps as in the first embodiment. It fetches the kth retransmission segment $x_{S_k}$ from the primary codeword buffer 62 and encodes it systematically into the kth IR mother codeword $x^{(k)}$ using any standard systematic polar encoding method. Once the kth IR mother codeword $x^{(k)}$ is ready, the systematic IR encoder 63 produces the kth IR codeword $r^{(k)}$ by puncturing $x^{(k)}$ as in the first embodiment, namely, by setting $r^{(k)}=x_{T_k^c}^{(k)}$.

Some explanatory remarks follow. The preferred embodiment leaves a great degree of flexibility in the choice of the IR code lengths $(N_1, N_2, \ldots, N_{m-1})$ and the IR payload lengths $(K_1, K_2, \ldots, K_{m-1})$. In many applications, the IR code lengths are constrained to be the same as the length of the primary code, that is, $N_1=N_2=\ldots=N_{m-1}=N$. Under such a constraint, it is preferable to choose the payload lengths as a non-increasing sequence, $K_1 \geq K_2 \geq \ldots \geq K_{m-1}$ so that the IR codes are progressively more powerful. In general, the choice of the IR payload lengths is the subject of a complex optimization problem that needs to be considered jointly with the choice of the selector sets $(S_1, S_2, \ldots, S_{m-1})$ and the nature of the decoding algorithms used at the HARQ receiver. Some heuristic methods for selecting the selector sets are described below.

The systematic IR encoder 63 in the preferred embodiment can be any standard type of systematic polar encoder. For purposes of being specific, a method of systematic polar encoding is described next. In the recommended method, the systematic IR encoder 63 encodes $x_{S_k}$ into $x^{(k)}$ through the following steps: 1) The systematic IR encoder 63 embeds the kth retransmission segment $x_{S_k}$ into a kth draft codeword v, which is a bit-vector of length $M_k$. The embedding of $x_{S_k}$ into v is accomplished by setting $v_{A_k}=x_{S_k}$. The systematic IR encoder 63 fills in the remaining coordinates of the kth draft codeword v with 0s by setting $v_{A_k^c}=0$, where $A_k^c$ is the complement of $A_k$ with respect to $\{1, 2, \ldots, M_k\}$ and 0 is an all-zero vector of length $|A_k^c|=M_k-K_k$. 2) The systematic IR encoder 63 computes the inverse polar transform of the kth draft codeword v and stores it in a kth draft source word w, wherein the kth draft source word w is a bit vector of length $M_k$. The inverse polar transform relation between v and w can be expressed as $w=v(G_{M_k})^{-1}$, wherein $(G_{M_k})^{-1}$ is the inverse of the polar transform matrix $G_{M_k}$. One representation of the polar transform is $G_{M_k}=F^{\otimes m_k}$ (with $m_k=\log(M_k)$), but the method described here can be applied with other forms of the polar transform (such as those that use a bit-reversal operation as part of the transform). 3) The systematic IR encoder 63 modifies the kth draft source word w by setting $w_{A_k^c}=0$ and produces the kth IR mother codeword by computing $x^{(k)}=wG_{M_k}$. It is well known that the kth IR mother codeword $x^{(k)}$ produced by this encoding method is systematic in the sense that $x_{A_k}^{(k)}=x_{S_k}$.

Turning to FIG. 9A, a design example 90 is shown, wherein the design example 90 exemplifies the preferred embodiment of the primary encoder 61 and the systematic IR encoder 63 in the HARQ transmitter 60 in further detail. The design example 90 comprises a primary code parameter list 91 which lists the design parameters of the primary code. The design example further comprises three IR code parameter lists 92, 93, and 94, which list, respectively, the design parameters of the first, second, and third IR codes. Thus, the maximum number of transmissions in the example HARQ session is m=4. First a description of the construction of the primary code is given. The primary code list 91 specifies the length of the primary code as N=16, the length of the input data packet as K=12, and the active segment selector as A={16,8,12,14,15,4,6,10,7,11,13,2}. The design of the active segment selector comprises generating a primary reliability list 95, wherein the primary reliability list is a listing of the coordinates {1, 2, . . . , N=16} of the source word u of the polar transform $x=uG_{N=16}$ in order of decreasing reliability. The primary reliability list 95 in the design example 90 is obtained by the Binary Erasure Channel (BEC) design rule with erasure probability ½. The BEC design rule is a well-known heuristic design rule for polar codes that generates the reliabilities of the coordinates of the source word under the modelling assumption that the forward channel is a BEC with a certain erasure probability (½ in this example). The first K=12 elements of the primary reliability list 95 produce the active segment selector A in the primary list 91. The subvector $u_A$ selected by A carries the input data packet. Note that $u_A=(u_2, u_4, u_6, u_7, u_8, u_{10}, u_{11}, u_{12}, u_{13}, u_{14}, u_{15}, u_{16})$ and the order of elements of $u_A$ is always in the natural increasing index order, independent of the order of the elements of the active segment selector A. This completes the description of the primary code.

The BEC design rule has been used in the above specification solely for purposes of illustration. It will be clear to those skilled in the art that the present principles can be applied with any other standard polar code design rule instead of the BEC design rule. In fact, it is more advantageous to use a polar code design rule based on a channel model that represents the actual channel conditions under which the system is likely to be used, rather than the BEC design rule, which implicitly models the channel as a BEC.

Attention is now turned to the first IR list 92, which describes the parameters of the first IR code. The first IR code has length $N_1=16$ and a payload size $K_1=8$. Hence, the first IR mother code has length $M_1=32$, which is the smallest integral power of two greater than or equal to $N_1+K_1=24$. The first IR data selector $S_1$ shown the first IR list 92 is obtained by taking the least reliable $K_1=8$ coordinates in the active segment selector A of the primary code according to the primary reliability list 95. The first IR data segment is $x_{S_1}=(x_2, x_4, x_6, x_7, x_{10}, x_{11}, x_{13}, x_{15})$. In accordance with the preferred embodiment, the first shortened segment selector $V_1$ is obtained as the set of coordinates from $N_1+K_1+1=25$ to $M_2=32$. The first systematic segment selector $A_1$ for the first IR mother code is constructed using the BEC design rule with erasure probability ½. (In general, the design rule for the first IR mother code does not have to be the same as the design rule for the primary code.) The BEC design rule ranks the coordinates {1, 2, . . . , $M_1=32$} of the first IR mother code and yields a first IR mother reliability list 96. After removing the coordinates in the first shortened segment selector $V_1$ from the first IR mother reliability list, a first shortened IR mother reliability list is obtained as (16, 24, 8, 12, 20, 14, 22, 15, 23, 4, 6, 10, 7, 18, 11, 19, 13, 21, 2, 3, 5, 9, 17, 1).

Taking the first $K_1=8$ elements of the first shortened IR mother reliability list, the first systematic segment selector is obtained as $A_1=\{16,24,8,12,20,14,22,15\}$. In accordance with the preferred embodiment, the first punctured segment selector $T_1$ is taken as $T_1=A_1\cup V_1$. The resulting length of the first IR codeword $r^{(1)}$ is $M_1-|T_1|=16$, which is consistent with the specified length $N_1=16$ in the first IR list 92. This completes the specification of the first IR code. The second IR list 93 in FIG. 9 lists the parameters of the second IR code. The length of the second IR code is specified as $N_2=16$ and the length of the second IR data selector as $K_2=5$. Accordingly, the second IR mother code has length $M_2=32$ and the second shortened segment selector $V_2$ is the set of integers from $N_2+K_2+1=22$ to $M_2=32$. The second IR mother code is constructed using the BEC design rule with erasure probability ½. (In general, the design rule for the second IR mother code does not have to be the same as the design rule for the first IR mother code.) Since the second IR mother code has the same length as the first IR mother code and the same BEC design rule is used for both, the first IR mother reliability list 96 is also valid for the second IR mother code. After removing from the list 96 the coordinates in the second shortened segment selector $V_2$, a second shortened IR mother reliability list is obtained as (16, 8, 12, 20, 14, 15, 4, 6, 10, 7, 18, 11, 19, 13, 21, 2, 3, 5, 9, 17, 1). Taking the first $K_2=5$ elements of the second shortened IR mother reliability list, the second systematic segment selector is obtained as $A_2=\{16,8,12,20,14\}$. In accordance with the preferred embodiment, the second punctured segment selector is taken as $T_2=A_2\cup V_2$. The design of the second IR data selector $S_2$ deserves special attention. The length of $S_2$ is specified as $K_2=5$. In the present example, the payload capacity $K_2=5$ of $S_2$ is filled by taking three elements from $S_1$ and two elements from $A\setminus S_1$.

Individual elements from $S_1$ and $A\setminus S_1$ that are to be included in $S_2$ are selected by giving priority to the elements with smaller reliability. The three elements from $S_1$ are selected as the least reliable three elements in $S_1$, namely, (11,13,2). The two elements from $A\setminus S_1$ are selected as the least reliable two elements in $A\setminus S_1$, namely, (12, 14). This yields $S_2=\{11,13,2,12,14\}$ and $x_{S_2}=(x_2, x_{11}, x_{12}, x_{13}, x_{14})$. This completes the description of the construction of the second IR code. The third IR list 94 in FIG. 9 lists the parameters of the third IR code. The length of the third IR code is specified as $N_3=16$ and the length of the third IR data segment as $K_3=4$. Accordingly, the third IR mother code has length $M_3=32$ and the third shortened segment selector $V_3$ is the set of integers from $N_3+K_3+1=21$ to $M_3=32$. The third IR mother code is constructed using the BEC design rule with erasure probability ½. Since the third IR mother code has the same length as the first IR mother code, the first IR mother reliability list 96 is also valid for the third IR mother code. After removing from the list 96 the coordinates in the third shortened segment selector $V_3$, a third shortened IR mother reliability list is obtained as (16, 8, 12, 20, 14, 15, 4, 6, 10, 7, 18, 11, 19, 13, 2, 3, 5, 9, 17, 1). Taking the first $K_3=4$ elements of the third shortened IR mother reliability list, the third systematic segment selector is obtained as $A_3=\{16,8,12,20\}$. In accordance with the rules of the preferred embodiment, the third punctured segment selector is taken as $T_3=A_3\cup V_3$. The third IR data selector $S_3$ is constructed by taking one element from $S_1$, one element from $S_1\setminus S_2$ and two elements from $A\setminus(S_1\cup S_2)$; this allocation is consistent with the specification $K_3=4$ as the size of $S_3$. The element selected from $S_2$ for inclusion in $S_3$ is selected as the least reliable element in $S_2$, namely, 14; the element selected from $S_1\setminus S_2$ is selected as the least reliable element in $S_1\setminus S_2$, namely, 7; and, the two elements selected from $A\setminus(S_1\cup S_2)$ are selected as the least reliable two elements in $A\setminus(S_1\cup S_2)$, namely, (16,8). This procedure gives $S_3=\{14,7,16,8\}$ and $x_{S_3}=(x_7, x_8, x_{14}, x_{16})$. This completes the description of the design of the third IR code for the present example. For illustration purposes, a numerical example is given next, where the input data packet is $$d=(0,0,1,0,0,1,0,0,1,0,0,1). \qquad (1)$$

The primary encoder 61 embeds d into the source word $u=(u_1, u_2, \ldots, u_{N=16})$ by setting $u_A=d$, or to be more precise, by setting $u_2=d_1$, $u_4=d_2$, $u_6=d_3$, $u_7=d_4$, $u_8=d_5$, $u_{10}=d_6$, $u_{11}=d_7$, $u_{12}=d_8$, $u_{13}=d_9$, $u_{14}=d_{10}$, $u_{15}=d_{11}$, and $u_{16}=d_{12}$. The primary encoder sets the remaining coordinates of the source word to zero, i.e., $u_1=0$, $u_3=0$, $u_5=0$, and $u_9=0$. This completes the preparation of the source word u.

In alternative implementations of the present principles, the frozen coordinates of the source word u may be set to a different pattern of bits (instead of the all-zero pattern) without affecting the applicability of the present principles. The primary encoder generates the primary codeword $x=(x_1, x_2, \ldots, x_{N=16})$ from the source word u by computing $x=uG_{N=16}$, where $$G_{16} = F^{\otimes 4} = \begin{bmatrix} 1 & 0 & 0 & 0 & 0 & 0 & 0 & 0 & 0 & 0 & 0 & 0 & 0 & 0 & 0 & 0 \\ 1 & 1 & 0 & 0 & 0 & 0 & 0 & 0 & 0 & 0 & 0 & 0 & 0 & 0 & 0 & 0 \\ 1 & 0 & 1 & 0 & 0 & 0 & 0 & 0 & 0 & 0 & 0 & 0 & 0 & 0 & 0 & 0 \\ 1 & 1 & 1 & 1 & 0 & 0 & 0 & 0 & 0 & 0 & 0 & 0 & 0 & 0 & 0 & 0 \\ 1 & 0 & 0 & 0 & 1 & 0 & 0 & 0 & 0 & 0 & 0 & 0 & 0 & 0 & 0 & 0 \\ 1 & 1 & 0 & 0 & 1 & 1 & 0 & 0 & 0 & 0 & 0 & 0 & 0 & 0 & 0 & 0 \\ 1 & 0 & 1 & 0 & 1 & 0 & 1 & 0 & 0 & 0 & 0 & 0 & 0 & 0 & 0 & 0 \\ 1 & 1 & 1 & 1 & 1 & 1 & 1 & 1 & 0 & 0 & 0 & 0 & 0 & 0 & 0 & 0 \\ 1 & 0 & 0 & 0 & 0 & 0 & 0 & 0 & 1 & 0 & 0 & 0 & 0 & 0 & 0 & 0 \\ 1 & 1 & 0 & 0 & 0 & 0 & 0 & 0 & 1 & 1 & 0 & 0 & 0 & 0 & 0 & 0 \\ 1 & 0 & 1 & 0 & 0 & 0 & 0 & 0 & 1 & 0 & 1 & 0 & 0 & 0 & 0 & 0 \\ 1 & 1 & 1 & 1 & 0 & 0 & 0 & 0 & 1 & 1 & 1 & 1 & 0 & 0 & 0 & 0 \\ 1 & 0 & 0 & 0 & 1 & 0 & 0 & 0 & 1 & 0 & 0 & 0 & 1 & 0 & 0 & 0 \\ 1 & 1 & 0 & 0 & 1 & 1 & 0 & 0 & 1 & 1 & 0 & 0 & 1 & 1 & 0 & 0 \\ 1 & 0 & 1 & 0 & 1 & 0 & 1 & 0 & 1 & 0 & 1 & 0 & 1 & 0 & 1 & 0 \\ 1 & 1 & 1 & 1 & 1 & 1 & 1 & 1 & 1 & 1 & 1 & 1 & 1 & 1 & 1 & 1 \end{bmatrix}.$$

This yields the primary codeword $$x=(0,1,1,1,1,0,1,1,1,0,1,1,0,1,1,1). \quad (2)$$

In preparing the first IR packet, the HARQ transmitter first selects the first codeword segment $x_{S_1}=(1,1,0,1,0,1,0,1)$. It is assumed in the present numerical example that the systematic IR encoder 63 uses the systematic encoding method that was described above in connection with the preferred embodiment. Accordingly, the first draft codeword $v^{(1)}$ is prepared by setting $V_{A_1}^{(1)}=x_{S_1}$ and $$v_{A_1^c}^{(1)} = 0,$$

which yields $$v^{(1)}=(0,0,0,0,0,0,1,0,0,0,10,0,1,0,0,0,0,1,0,0,0,1,0,0,\\0,0,0,0,0,0).$$

The first draft source word $w^{(1)}$ is obtained from the first draft codeword $v^{(1)}$ by an inverse polar transform operation, $$w^{(1)}=(1,0,1,0,1,0,1,0,0,1,0,1,1,0,1,0,0,0,0,0,0,1,1,1,1,0,\\0,0,0,0,0,0).$$

The frozen coordinates of the first draft source word are set to zero, and the first modified source word is obtained as $$w^{(1)}=(0,0,0,0,0,0,0,0,0,0,1,0,0,1,0,0,0,0,0,0,0,1,0,1,0,\\0,0,0,0,0,0).$$

The polar transform operation $x^{(1)}=w^{(1)}G_N$ produces the first IR mother codeword $$x^{(1)}=(0,1,1,0,1,0,0,1,0,1,0,1,1,0,1,0,0,0,1,1,0,0,1,1,0,0,\\0,0,0,0,0,0) \quad (3)$$

It can be verified that the encoding is symmetric in the sense that $x_{A_1}^{(1)}=x_{S_1}$. The first IR codeword is obtained by the puncturing operation $$r^{(1)} = x_{T_1^c}^{(1)}$$

as $$r^{(1)}=(0,1,1,0,1,0,0,0,1,0,1,0,0,1,0,1). \quad (4)$$

In similar manner, the second and third IR mother codewords and the second and third IR codewords are obtained as $$x^{(2)}=(0,0,1,1,0,0,1,1,0,0,1,1,1,1,0,0,1,1,1,1,0,0,0,0,0,0,\\0,0,0,0,0,0), \quad (5)$$

$$r^{(2)}=(0,0,1,1,0,0,1,0,0,1,1,0,1,1,1,0), \quad (6)$$

$$x^{(3)}=(0,0,0,0,1,1,1,1,1,1,1,1,1,1,1,1,1,1,1,1,0,0,0,0,0,0,\\0,0,0,0,0,0), \quad (7)$$

$$r^{(3)}=(0,0,0,0,1,1,1,1,1,1,1,1,1,1,1,1). \quad (8)$$

This completes the description of how the systematic IR encoder 63 operates in the design example 90.

Figure 9B:
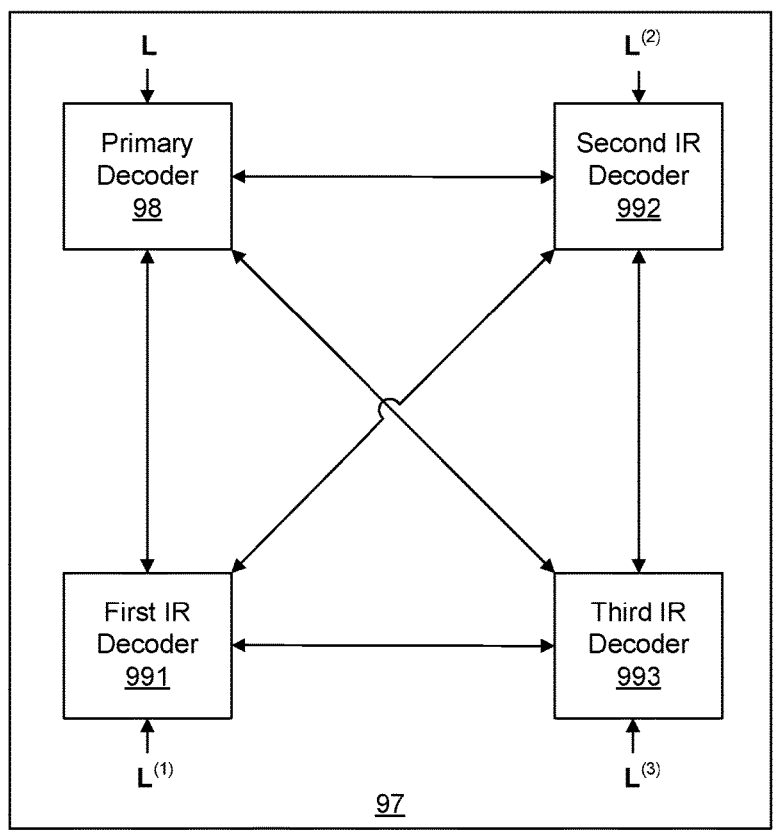
FIG. 9B is a diagram illustrating a HARQ decoder for a preferred embodiment of the present principles.

Turning attention to the receiver side for the design example 90, FIG. 9B depicts an example HARQ decoder 97 that can be used at the receiver side. The example HARQ decoder 97 constitutes an example of the preferred embodiment of the HARQ decoder 73. The example HARQ decoder 97 comprises a primary decoder 98, wherein the primary decoder 98 is any decoder that can be used to decode the primary code as defined by primary code parameter list 91. When the primary code is a polar code as in the present example, the primary decoder 98 may be a successive cancellation (SC) decoder, a belief propagation (BP) decoder, or a list decoder. The HARQ decoder further comprises a first IR decoder 991, a second IR decoder 992, and a third IR decoder 993, wherein the IR decoders 991, 992, and 993 are, respectively, decoders for the IR codes defined by the IR parameter lists 92, 93, and 94. In the preferred embodiment of the present principles, the IR codes are polar codes and, accordingly, the IR decoders 991, 992, and 993 should be chosen as decoders suitable for decoding polar codes. Options for the IR decoders 991, 992, and 993 include SC decoding, BP decoding, and list decoding. The IR decoders 991, 992, and 993 may be of different types of polar decoders, each optimized for the corresponding decoding task. BP decoding has the advantage of allowing the decoders to exchange soft information. SC decoding has the advantage of being simpler.

In the following, an example scenario is described where the primary decoder 98 and the IR decoders employ SC decoding and exchange hard decisions. To be specific, it is assumed that the packet transmitter 64 employs Binary Phase Shift Keying (BPSK) as the modulation scheme in transmitting the primary packet and the IR packets; in other words, it is assumed that the primary codeword x is mapped to a BPSK signal vector s by the transformation $s=\alpha(1-2x)$, wherein $\alpha$ is an amplitude and 1 is a vector of is having the same length as the primary codeword x. This transformation converts each element $x_i$ of the primary codeword to the BPSK signal $s_i$ so that $s_i=\alpha$ if $x_i=0$ and $s_i=-\alpha$ if $x_i=1$. Likewise, it is assumed that the kth IR codeword $r^{(k)}$ is mapped into a BPSK signal vector $s^{(k)}$ by the transformation $s^{(k)}=\alpha(1-2r^{(k)})$. The use of BPSK modulation in the example is solely for purposes of demonstration and is not a limiting feature of the present principles. In particular, it will be apparent to one skilled in the art that the present principles can be utilized in systems employing other types of modulation such as Quadrature Amplitude Modulation (QAM) with any number of constellation points (4, 16, 64, etc.).

In the example scenario, it is assumed that the forward channel 14 is an additive Gaussian noise channel. The channel output for the primary codeword and the kth IR codeword will be denoted by y and $y^{(k)}$, respectively. More specifically, y=s+n and $y^{(k)}=s^{(k)}+n^{(k)}$ where n and $n^{(k)}$ represent channel noise. The noise vectors n and $n^{(k)}$ are composed of independent identically distributed Gaussian random variables with mean 0 and variance $\sigma^2$. It is further assumed that n is independent of s and $n^{(k)}$ is independent of $s^{(k)}$. The use of an additive Gaussian noise channel here is for purposes of illustration only. The present principles can be used with other types of channels, such as channels with multi-path fading, Doppler shift, multi-user interference, impulsive noise, etc.

In a typical digital communication system, there is significant amount of signal processing (synchronization, equalization, sampling, etc.) involved in obtaining the discrete-time signals y and $y^{(k)}$ from the received packets at the output of the forward channel 14. Such signal processing is done by the frontend processor 71 in the HARQ receiver 70. In the example, it is assumed that the frontend processor carries out demodulation and soft-in soft-out (SISO) demapping functions as well, and delivers to the HARQ decoder 73 log-likelihood ratios (LLRs), comprising a primary LLR L and a kth LLR $L^{(k)}$, relating to the primary codeword and the kth IR codeword, respectively. The ith component of the primary LLR L is given by $$L_i = \log \frac{P(y_i | x_i = 0)}{P(y_i | x_i = 1)}.$$

Likewise, the ith component of the kth LLR $L^{(k)}$ is given by $$L_i^{(k)} = \log \frac{P(y_i^{(k)} | r_i^{(k)} = 0)}{P(y_i^{(k)} | r_i^{(k)} = 1)}.$$

For the additive Gaussian noise channel here, these LLRs calculations simplify to the expressions $L_i=2\alpha y_i/\sigma^2$ and $L_i^{(k)}=2\alpha y_i/\sigma^2$. For other types of forward channels, the appropriate formulas for calculating the LLRs are common knowledge to those skilled in the art of communications engineering.

Details of the operation of the HARQ decoder 73 will be explained by continuing the above numerical example for the HARQ transmitter, wherein the input data packet is given by Eq. (1), the primary codeword by Eq. (2), and the IR codewords by Eqs. (4), (6), and (8). It will be assumed that the channel signal-to-noise ratio (SNR) is (−1) decibel (dB); wherein the channel SNR in dB is defined as $$SNR = 20\log_{10}\left(\frac{\alpha}{\sigma}\right).$$

In the numerical example, the HARQ receiver 70 receives $$y=(1.6,-1.9,-0.5,-2.3,0.1,0.5,0.1,-2.4,0.2,2.1,-0.3,$$
$$0.4,2.5,-1.2,-1.9,-2.6) \quad (9)$$

as the primary channel output, and the frontend processor 71 computes the primary LLR as $$L = \left(\frac{2\alpha}{\sigma^2}\right) y = 1.588 y. \quad (10)$$

The primary decoder 98 takes the primary LLR L in Eq. (10) as input and carries out a first primary decoding with the goal of recovering the input data packet d of Eq. (1). This first primary decoding produces a first estimate of the input data packet, wherein the first estimate of the input data packet in this numerical example happens to be $$\hat{d}^{(1)}=(1,1,1,1,0,0,1,1,1,0,0,1). \quad (11)$$

This first estimate in Eq. (11) differs from the true value of the input data packet d in Eq. (1) in six positions. Hence, the HARQ receiver 70 sends a NACK to the HARQ transmitter 60, and the HARQ transmitter responds by sending the first IR codeword $r^{(1)}$, as given by Eq. (4) in this example. The HARQ receiver 70 receives $$y^{(1)}=(0.1,-0.2,0.3,2.2,-1.9,2.8,2.7,-1.5,-1.6,0.3,-0.3,$$
$$0.3,1.7,0.1,0.1,-1.5)$$

as the channel output for the first IR codeword $r^{(1)}$, and the frontend processor 71 computes the first IR LLR as $$L^{(1)} = \left(\frac{2\alpha}{\sigma^2}\right) y^{(1)} = 1.588 y^{(1)}.$$

The first IR decoder 991 receives the first IR LLR and carries out a first decoding of the first IR codeword. The first decoding of the first IR codeword is carried out indirectly by carrying out a first decoding for the first IR mother codeword $x^{(1)}$ in Eq. (3). Before the first decoding for first IR mother codeword begins, a suitable first IR mother LLR $\tilde{L}^{(1)}$ is constructed, wherein the first IR mother LLR is a vector of length $N_2=32$. The first IR mother LLR is constructed by filling in the coordinates of $\tilde{L}^{(1)}$ as follows:

$$\tilde{L}_{T_1^c}^{(1)} = L^{(1)}, \tilde{L}_{V_1}^{(1)} = \infty, \text{ and } \tilde{L}_{A_1}^{(1)} = L_{S_1}.$$

The equation $$\tilde{L}_{T_1^c}^{(1)} = L^{(1)}$$

signifies that the only part of the first IR mother codeword that was sent over the forward channel was the part indexed by the set $T_1^c$; so, the corresponding components of the first IR mother LLR are filled in with the first IR LLR. The equation $\tilde{L}_{V_1}^{(1)}=\infty$ means that each coordinate of the IR mother LLR vector that lies in the set $V_1$ are set to as large a number as the precision of the LLR values allows, for example, to 127 if 8 bit signed integers are used; the setting of an LLR value to a large value signifies that the decoder has full knowledge of the corresponding bit (which is the case for bits in $V_1$ since those bits are fixed to 0 as part of the shortening operation applied at the systematic IR encoder 63). The equation $\tilde{L}_{A_1}^{(1)}=L_{S_1}$ recycles the LLR values $L_{S_1}$ from the primary LLR. After these substitutions, the first IR decoder 991 uses the IR mother LLR $\tilde{L}^{(1)}$ to produce a first estimate of the first IR mother codeword. In this example, the first estimate of the first IR mother codeword is obtained as $$\hat{x}^{(1)}=(0,1,1,0,1,0,0,1,0,1,0,1,1,0,1,0,0,0,1,1,0,0,1,1,0,0,$$
$$0,0,0,0,0,0). \quad (12)$$

The first estimate of the first IR mother codeword in Eq. (12) happens to coincide with the first IR mother codeword $x^{(1)}$ in Eq. (3); however, the first IR decoder 991 does not know this. The present principles do not require that the first IR decoder or any subsequent IR decoder be able to determine that any of the estimates that they produce is a correct estimate. The next step for the first IR decoder is to pass the part $\hat{x}_{A_1}^{(1)}$ to the primary decoder 98. The primary decoder assumes that $\hat{x}_{A_1}^{(1)}$ is a correct estimate of $x_{S_1}$ and updates the segment $L_{S_1}$ of the primary LLR as $L_i = \infty$ if $\hat{x}_i^{(1)} = 0$ and $L_i = -\infty$ if $\hat{x}_i^{(1)} = 1$ for each $i \in S_1$. Following the update of the primary LLR, the primary decoder 98 uses the updated primary LLR to produce a second estimate of the input data packet. In the present example, the second estimate of the input data packet is obtained as $$\hat{d}^{(2)}=(0,0,1,0,0,1,0,0,1,0,0,1). \quad (13)$$

The second estimate in Eq. (13) is correct as it coincides with the input data packet d in Eq. (3). As mentioned before, the present principles comprise methods such as CRC to determine with sufficient reliability that $\hat{d}^{(1)}$, $\hat{d}^{(2)}$, and any subsequent estimates by the primary decoder are correct. At this point, the HARQ receiver 70 sends an ACK and the present HARQ session is completed with success.

In general, the HARQ session in the above example would continue if the second estimate $\hat{d}^{(2)}$ were incorrect. In that case, a NACK would be sent by the HARQ receiver 70 and the HARQ transmitter 60 would send a second IR codeword. The HARQ decoder would prepare a second IR mother LLR $\tilde{L}^{(2)}$ in the same way as in the preparation of the first IR mother LLR $\tilde{L}^{(1)}$. The second IR decoder 992 would then produce a first estimate of the second IR mother codeword and pass it to the primary decoder 98 and the first IR decoder 991. The first IR mother codeword and the second IR mother codeword have in common the payload $x_{S_1 \cap S_2}$. In the present example, $S_1 \cap S_2 = \{2, 11, 13\}$. Thus, the first IR decoder 991 would have the option to produce a second estimate of the first IR mother codeword by using the estimate of $x_{S_1 \cap S_2}$ provided by the second IR decoder 992. After producing such a second estimate of the first IR mother codeword, the first IR decoder would send the second estimate of the first IR codeword to the primary decoder 98. The primary decoder in turn would utilize the first estimate of the second IR mother codeword and the second estimate of the first IR mother codeword, and produce a third estimate of the input data packet. If the third estimate of the input data packet does not pass the error detection test, it should be clear to one skilled in the art that the above process can be continued after receiving a third IR packet. This completes the description of successive cancellation (SC) decoding method as an example of a preferred embodiment of the HARQ decoder 97.

The SC decoding method in the illustrative example of the HARQ decoder 97 is sequential in nature in the sense that the decoder estimates flow in a directed tree consisting of the braches connecting 993 to 992, 992 to 991, and 991 to 98. This sequential flow of information is suitable for successive cancellation decoding, and has the advantage of simplicity. However, the present principles can be applied with more general decoding techniques in which decoding estimates can be passed among all the decoders 98, 991, 992, 993 according to a specific schedule and decoding may continue for many iterations. Furthermore, unlike the SC example above, the messages exchanged may contain soft information instead of hard decisions. It will be apparent to one skilled in the art that BP decoding can be used with advantage over SC decoding when the primary decoder and the IR decoders exchange information with each other since BP decoding allows the exchange of soft information in a natural manner. Such generalized methods have the potential to improve performance at the expense of complexity. The present principles derive a major advantage over the prior art on HARQ with polar codes by allowing the HARQ decoder to exploit iterative message passing decoding algorithms. The use of systematic polar codes for implementing the IR codes is the key enabler of constructing a message-passing decoder at the HARQ receiver.

Figure 10:
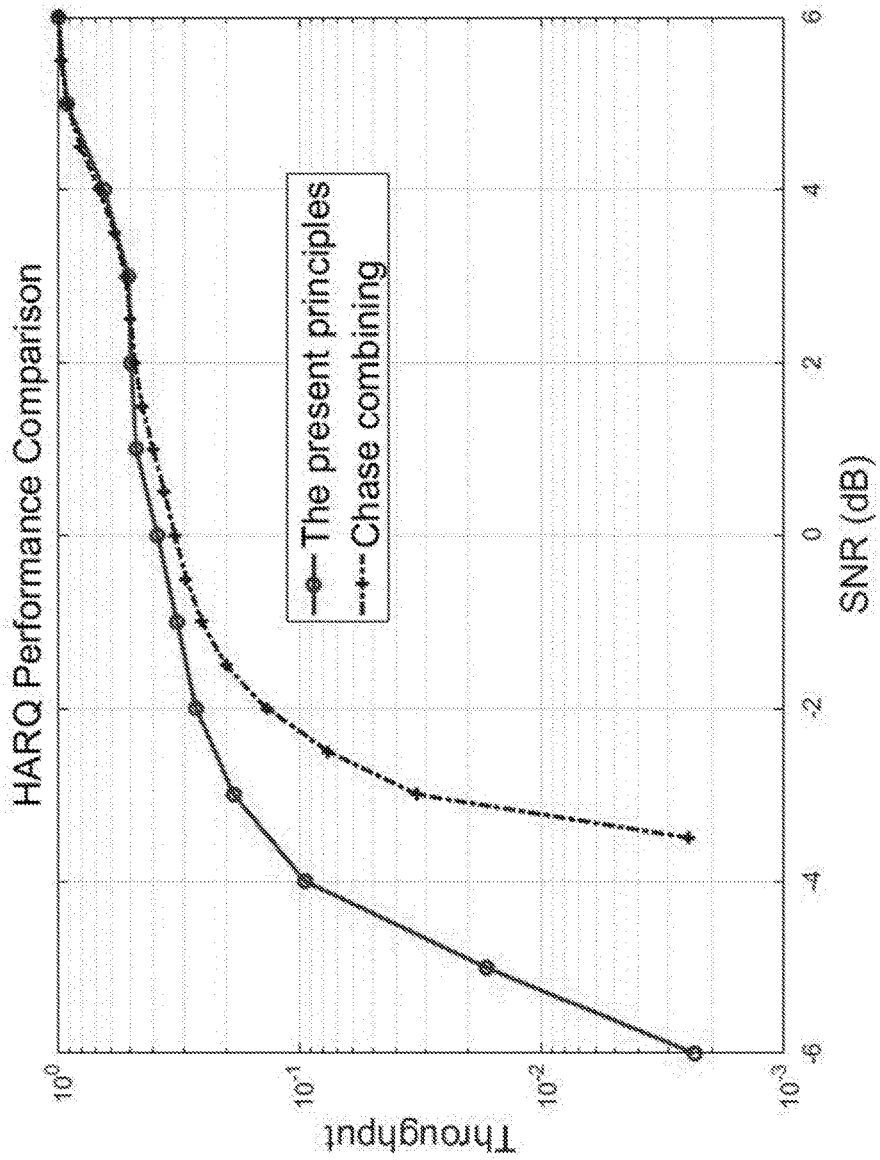
FIG. 10 is a graph illustrating the performance of various HARQ schemes.

FIG. 10 is a graph illustrating the performance advantage of the present principles over the benchmark CC-HARQ method. The vertical axis of the graph is the throughput. The horizontal axis is the SNR value in dB. The primary code here has length N=256 and the input data packet has length K=192. The HARQ scheme employs m=3 rounds of IR transmission. The lengths of the IR mother codes are $M_1=M_2=M_3=512$. The lengths of the IR codewords are $N_1=N_2=N_3=256$, while the IR payload sizes are $K_1=162$, $K_2=87$, and $K_3=60$. The HARQ system uses BPSK modulation. The forward channel is an additive Gaussian noise channel. The primary decoder and the IR decoders employ BP decoding. The graph in FIG. 10 shows that, at high SNR, the present principles provide similar throughput as the benchmark CC-HARQ, but outperforms CC-HARQ at low SNR. Thus, compared to CC-HARQ, the present principles enable the communication system to operate over a wider dynamic range of SNR.

Figure 11:
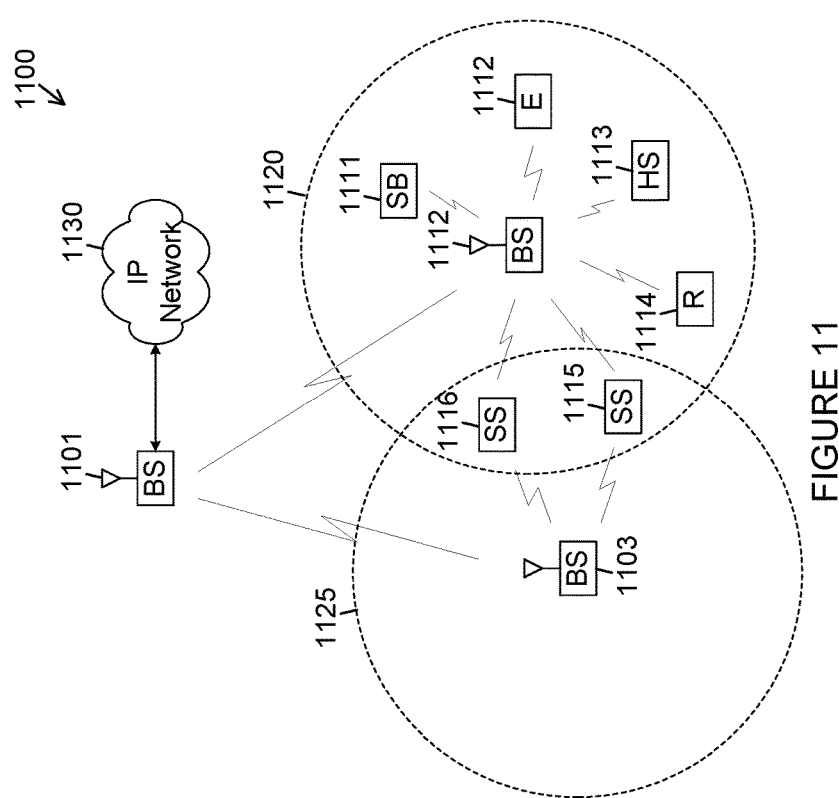
FIG. 11 illustrates an example wireless network within which HARQ using systematic polar coding may be implemented according to this disclosure.

FIG. 11 illustrates an example wireless network within which HARQ using systematic polar coding may be implemented according to this disclosure. The embodiment of the wireless network 1100 shown in FIG. 11 is for illustration only. Other embodiments of the wireless network 1100 could be used without departing from the scope of this disclosure. The wireless network 1100 includes an eNodeB (eNB) 1101, an eNB 1102, and an eNB 1103. The eNB 1101 communicates with the eNB 1102 and the eNB 1103. The eNB 1101 also communicates with at least one Internet Protocol (IP) network 1130, such as the Internet, a proprietary IP network, or other data network.

Depending on the network type, other well-known terms may be used instead of "eNodeB" or "eNB," such as "base station" or "access point." For the sake of convenience, the terms "eNodeB" and "eNB" are used in this patent document to refer to network infrastructure components that provide wireless access to remote terminals. Also, depending on the network type, other well-known terms may be used instead of "user equipment" or "UE," such as "mobile station" (or "MS"), "subscriber station" (or "SS"), "remote terminal," "wireless terminal," or "user device." For the sake of convenience, the terms "user equipment" and "UE" are used in this patent document to refer to remote wireless equipment that wirelessly accesses an eNB, whether the UE is a mobile device (such as a mobile telephone or smartphone) or is normally considered a stationary device (such as a desktop computer or vending machine).

The eNB 1102 provides wireless broadband access to the network 1130 for a first plurality of user equipments (UEs) within a coverage area 1120 of the eNB 1102. The first plurality of UEs includes a UE 1111, which may be located in a small business (SB); a UE 1112, which may be located in an enterprise (E); a UE 1113, which may be located in a WiFi hotspot (HS); a UE 1114, which may be located in a first residence (R); a UE 1115, which may be located in a second residence (R); and a UE 1116, which may be a mobile device (M) like a cell phone, a wireless laptop, a wireless personal digital assistant (PDA), or the like. The eNB 1103 provides wireless broadband access to the network 1130 for a second plurality of UEs within a coverage area 1125 of the eNB 1103. The second plurality of UEs includes the UE 1115 and the UE 1116. In some embodiments, one or more of the eNBs 1101-1103 may communicate with each other and with the UEs 1111-1116 using 3G, 4G or 5G, long-term evolution (LTE), LTE-A, WiMAX, or other advanced wireless communication techniques.

Dotted lines show the approximate extents of the coverage areas 1120 and 1125, which are shown as approximately circular for the purposes of illustration and explanation only. It should be clearly understood that the coverage areas associated with eNBs, such as the coverage areas 1120 and 1125, may have other shapes, including irregular shapes, depending upon the configuration of the eNBs and variations in the radio environment associated with natural and man-made obstructions.

As described in more detail below, one or more of BS 1101, BS 1102 and BS 1103 include 2D antenna arrays as described in embodiments of the present disclosure. In some embodiments, one or more of BS 1101, BS 1102 and BS 1103 support the codebook design and structure for systems having 2D antenna arrays.

Although FIG. 11 illustrates one example of a wireless network 1100, various changes may be made to FIG. 11. For example, the wireless network 1100 could include any number of eNBs and any number of UEs in any suitable arrangement. Also, the eNB 1101 could communicate directly with any number of UEs and provide those UEs with wireless broadband access to the network 1130. Similarly, each eNB 1102-1103 could communicate directly with the network 1130 and provide UEs with direct wireless broadband access to the network 1130. Further, the eNB 1101, 1102, and/or 1103 could provide access to other or additional external networks, such as external telephone networks or other types of data networks.

The example HARQ system 10 depicted in FIG. 1 and described above may be implemented in an eNB (such as eNB 1102) and/or a UE (such as UE 1116), as described in further detail below.

Figure 12A:
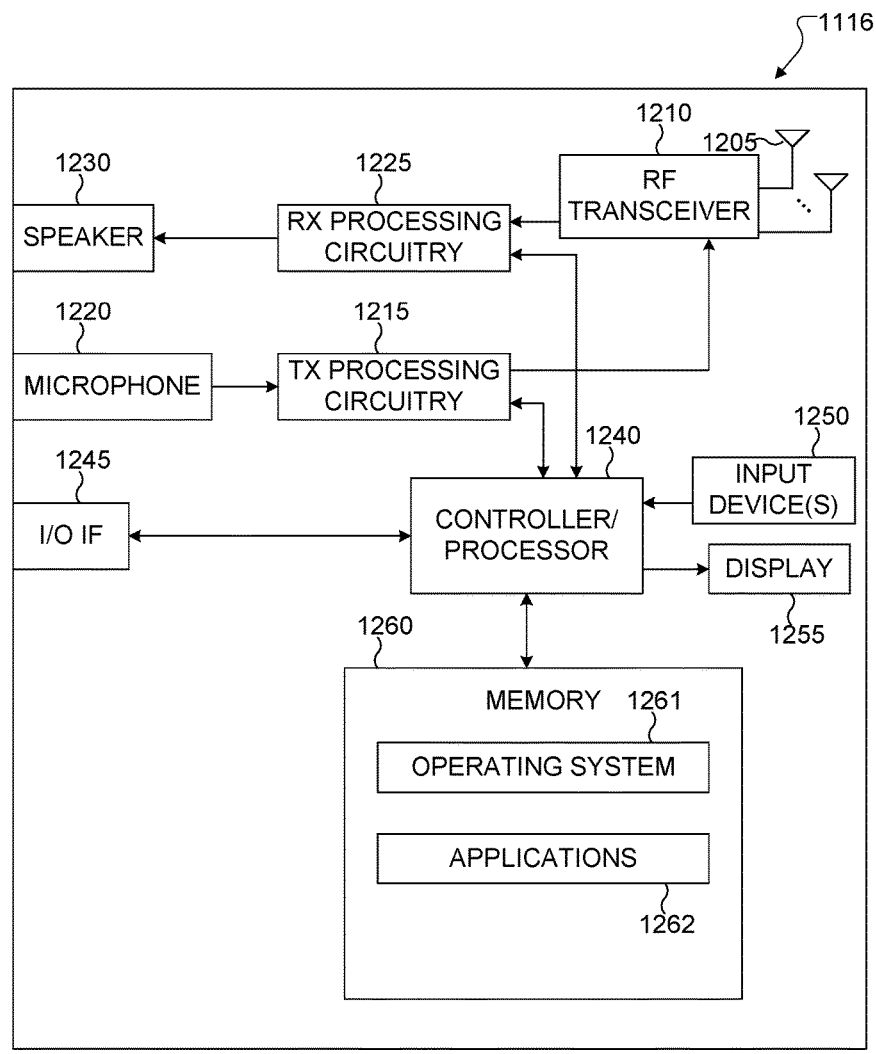
FIG. 12A illustrates an example user equipment network within which HARQ using systematic polar coding may be implemented according to this disclosure.

FIG. 12A illustrates an example user equipment network within which HARQ using systematic polar coding may be implemented according to this disclosure. The embodiment of the UE 1116 illustrated in FIG. 12A is for illustration only, and the UEs 1111-1115 of FIG. 11 could have the same or similar configuration. However, UEs come in a wide variety of configurations, and FIG. 12A does not limit the scope of this disclosure to any particular implementation of a UE.

The UE 1116 includes an antenna 1205, a radio frequency (RF) transceiver 1210, transmit (TX) processing circuitry 1215 (which may be the HARQ transmitter 13 in FIG. 1), a microphone 1220, and receive (RX) processing circuitry 1225 (which may be HARQ receiver 15 in FIG. 1). The UE 1116 also includes a speaker 1230, a main processor 1240, an input/output (I/O) interface (IF) 1245, a keypad 1250, a display 1255, and a memory 1260. The memory 1260 includes a basic operating system (OS) program 1261 and one or more applications 1262. Either the OS program 1261, one of the applications 1262, or some combination thereof may implement programming for a HARQ scheme as described in the various embodiments of FIGS. 1 through 10.

The RF transceiver 1210 receives, from the antenna 1205, an incoming RF signal (including primary and secondary packets described above) transmitted by an eNB of the network 1100. The RF transceiver 1210 may down-convert the incoming RF signal to generate an intermediate frequency (IF) or baseband signal which would be sent to the receiver (Rx) processing circuitry 1225. The Rx processing circuitry 1225 transmits the processed signal to the speaker 1230 (such as for voice data) or to the main processor 1240 for further processing (such as for web browsing data).

The transmit (Tx) processing circuitry 1215 receives, as at least some input data for the input data packets 11, analog or digital voice data from the microphone 1220 or other outgoing baseband data (such as web data, e-mail, or interactive video game data) from the main processor 1240. The Tx processing circuitry 1215 implements HARQ transmitter 13. The RF transceiver 1210 receives the outgoing processed baseband or IF signal from the Tx processing circuitry 1215 and up-converts the baseband or IF signal to an RF signal that is transmitted via the antenna 1205.

The main processor 1240 can include one or more processors or other processing devices and execute the basic OS program 1261 stored in the memory 1260 in order to control the overall operation of the UE 1116. For example, the main processor 1240 could control the reception of forward channel signals and the transmission of reverse channel signals by the RF transceiver 1210, the Rx processing circuitry 1225, and the Tx processing circuitry 1215 in accordance with well-known principles. In some embodiments, the main processor 1240 includes at least one programmable microprocessor or microcontroller, while in other embodiments the main processor includes dedicated circuitry (e.g., for systemic and/or non-systematic encoding or decoding processes, puncturing processes, data mapping, etc.) as well as (optionally) programmable logic or processing circuits.

The main processor 1240 is also capable of executing other processes and programs resident in the memory 1260, such as operations for channel quality measurement and reporting for systems having 2D antenna arrays as described in embodiments of the present disclosure. The main processor 1240 can move data and/or instructions into or out of the memory 1260 as required by an executing process. In some embodiments, the main processor 1240 is configured to execute the applications 1262 based on the OS program 1261 or in response to signals received from eNBs or an operator. The main processor 1240 is also coupled to the I/O interface 1245, which provides the UE 1116 with the ability to connect to other devices such as laptop computers and handheld computers. The I/O interface 1245 is the communication path between these accessories and the main controller 1240.

The main processor 1240 is also coupled to the keypad 1250 (which may simply be a single button or may be an array or other set of buttons) and the display unit 1255. The operator of the UE 1116 can use the keypad 1250 to enter data into the UE 1116. The display 1255 may be a touch screen display or other display capable of rendering text and/or at least limited graphics, such as from web sites, and receiving touch inputs by a user in accordance with known practices. The memory 1260 is coupled to the main processor 1240, and at least a part of the memory 1260 could include a random access memory (RAM), and another part of the memory 1260 could include a Flash memory or other read-only memory (ROM).

Although FIG. 12A illustrates one example of UE 1116, various changes may be made to FIG. 12A. For example, various components in FIG. 12A could be combined, further subdivided, or omitted and additional components could be added according to particular needs. As a particular example, the main processor 1240 could be divided into multiple processors, such as one or more central processing units (CPUs) and one or more graphics processing units (GPUs). Also, while FIG. 12A illustrates the UE 1116 configured as a mobile telephone or smartphone, UEs could be configured to operate as other types of mobile or stationary devices.

Figure 12B:
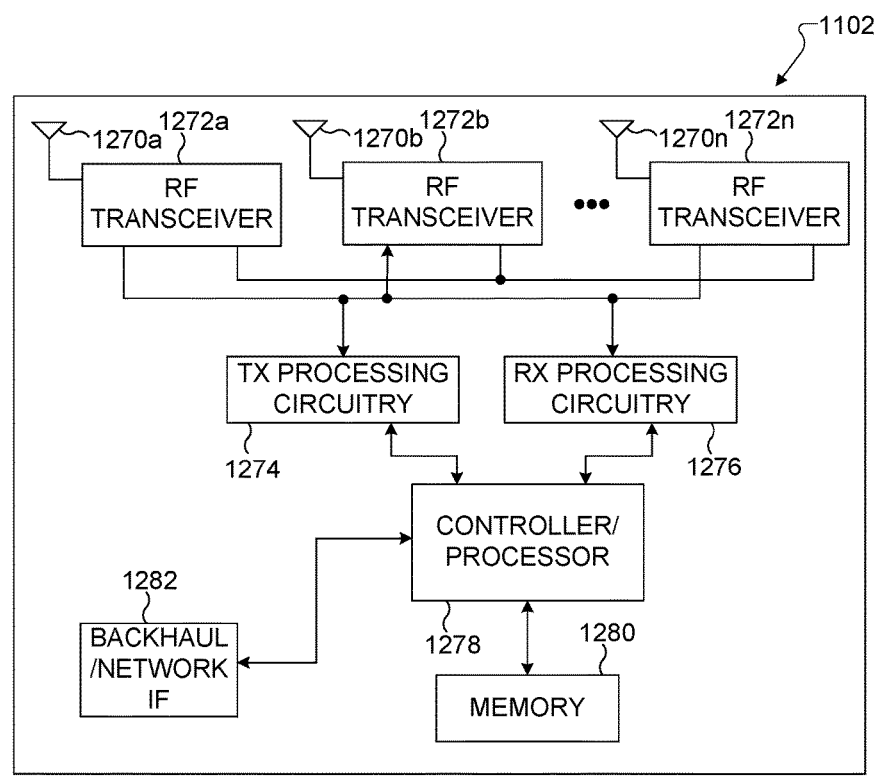
FIG. 12B illustrates an example enhanced NodeB (eNB) network within which HARQ using systematic polar coding may be implemented according to this disclosure.

FIG. 12B illustrates an example enhanced NodeB (eNB) network within which HARQ using systematic polar coding may be implemented according to this disclosure. The embodiment of the eNB 1102 shown in FIG. 12B is for illustration only, and other eNBs of FIG. 11 could have the same or similar configuration. However, eNBs come in a wide variety of configurations, and FIG. 12B does not limit the scope of this disclosure to any particular implementation of an eNB. It is noted that eNB 1101 and eNB 1103 can include the same or similar structure as eNB 1202.

As shown in FIG. 12B, the eNB 1102 includes multiple antennas 1270*a*-1270*n*, multiple RF transceivers 1272*a*-1272*n*, transmit (Tx) processing circuitry 1274, and receive (Rx) processing circuitry 1276. In certain embodiments, one or more of the multiple antennas 1270*a*-1270*n* include 2D antenna arrays. The eNB 1102 also includes a controller/processor 1278, a memory 1280, and a backhaul or network interface 1282.

The RF transceivers 1272*a*-1272*n* receive, from the antennas 1270*a*-1270*n*, incoming RF signals, such as signals transmitted by UEs or other eNBs. The RF transceivers 1272*a*-1272*n* down-convert the incoming RF signals to generate IF or baseband signals. The IF or baseband signals are sent to the Rx processing circuitry 1276, which generates processed signals by filtering, decoding, and/or digitizing the baseband or IF signals. The Rx processing circuitry 1276 transmits the processed signals to the controller/processor 1278 for further processing.

The Tx processing circuitry 1274 receives, as at least some input data for input data packets 11, analog or digital data (such as voice data, web data, e-mail, or interactive video game data) from the controller/processor 1278. The Tx processing circuitry 1274 implements source encoder and channel encoder to encode, multiplex, and/or digitize the outgoing baseband data to generate processed signals. The RF transceivers 1272*a*-1272*n* receive the outgoing processed signals from the Tx processing circuitry 1274 and up-converts the baseband or IF signals to RF signals that are transmitted via the antennas 1270*a*-1270*n*.

The controller/processor 1278 can include one or more processors or other processing devices that control the overall operation of the eNB 1102. For example, the controller/processor 1278 could control the reception of forward channel signals and the transmission of reverse channel signals by the RF transceivers 1272*a*-1272*n*, the Rx processing circuitry 1276, and the Tx processing circuitry 1274 in accordance with well-known principles. The controller/processor 1278 could support additional functions as well, such as more advanced wireless communication functions. Any of a wide variety of other functions could be supported in the eNB 1102 by the controller/processor 1278. In some embodiments, the controller/processor 1278 includes at least one microprocessor or microcontroller, while in other embodiments the main processor includes dedicated circuitry (e.g., for systemic and/or non-systematic encoding processes, puncturing processes, data mapping, etc.) as well as (optionally) programmable logic or processing circuits.

The controller/processor 1278 is also capable of executing programs and other processes resident in the memory 1280, such as a basic OS. The controller/processor 1278 is also capable of supporting channel quality measurement and reporting for systems having 2D antenna arrays as described in embodiments of the present disclosure. In some embodiments, the controller/processor 1278 supports communications between entities. The controller/processor 1278 can move data and/or instructions into or out of the memory 1280 as required by an executing process.

The controller/processor 1278 is also coupled to the backhaul or network interface 1282. The backhaul or network interface 1282 allows the eNB 1102 to communicate with other devices or systems over a backhaul connection or over a network. The interface 1282 could support communications over any suitable wired or wireless connection(s). For example, when the eNB 1102 is implemented as part of a cellular communication system (such as one supporting 3G, 4G, 5G, LTE, or LTE-A), the interface 1282 could allow the eNB 1102 to communicate with other eNBs over a wired or wireless backhaul connection. When the eNB 1102 is implemented as an access point, the interface 1282 could allow the eNB 1102 to communicate over a wired or wireless local area network or over a wired or wireless connection to a larger network (such as the Internet). The interface 1282 includes any suitable structure supporting communications over a wired or wireless connection, such as an Ethernet or RF transceiver.

The memory 1280 is coupled to the controller/processor 1278. Part of the memory 1280 could include a RAM, and another part of the memory 1280 could include a Flash memory or other ROM. In certain embodiments, a plurality of instructions is stored in memory. The plurality of instructions are configured to cause the controller/processor 1278 to perform the systemic and/or non-systematic encoding or decoding processes, puncturing processes, data mapping, etc.

Although FIG. 12B illustrates one example of an eNB 1102, various changes may be made to FIG. 12B. For example, the eNB 1102 could include any number of each component shown. As a particular example, an access point could include a number of interfaces 1282, and the controller/processor 1278 could support routing functions to route data between different network addresses. As another particular example, while shown as including a single instance of Tx processing circuitry 1274 and a single instance of Rx processing circuitry 1276, the eNB 1102 could include multiple instances of each (such as one per RF transceiver).

While the particular METHOD AND SYSTEM FOR RETRANSMITTING DATA USING SYSTEMATIC POLAR CODING is herein described in detail and is depicted in the drawings, it is to be understood that the subject matter which is encompassed by the present disclosure is limited only by the claims. Although the present disclosure has been described with exemplary embodiments, various changes and modifications may be suggested to one skilled in the art. It is intended that the present disclosure encompass such changes and modifications that fall within the scope of the appended claims. The description in the present application should not be read as implying that any particular element, step, or function is an essential or critical element which must be included in the claim scope: the scope of patented subject matter is defined only by the allowed claims. Moreover, none of these claims are intended to invoke 35 USC § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element,"

"member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

What is claimed is:

1. A hybrid automatic repeat request (HARQ) transmitter apparatus for use in transmitting an input data packet in a communications system employing a HARQ protocol in a HARQ session with a maximum transmission limit m, wherein the maximum transmission limit m is an integer greater than or equal to 2, the HARQ transmitter apparatus comprising:
   a primary encoder configured to receive an input data packet to start the HARQ session and encode the input data packet into a primary codeword from a primary code;
   a packet transmitter configured to receive the primary codeword and transmit the primary codeword inside a primary packet over a communications channel; and
   a systematic incremental redundancy (IR) encoder configured to select a kth IR data segment, encode the kth IR data segment in a systematic manner into a kth IR mother codeword from a kth IR mother code, and produce a kth IR codeword from the kth IR mother codeword by a puncturing of the kth IR mother codeword;
   wherein the packet transmitter is further configured to receive the kth IR codeword and transmit the kth IR codeword inside a kth IR packet over the communications channel,
   wherein k is an integer greater than or equal to 1 and less than or equal to (m−1),
   wherein the kth IR data segment is a subvector of the primary codeword,
   wherein the kth IR packet is transmitted in response to receiving a kth negative acknowledgement (NACK) in the HARQ session,
   wherein the HARQ session ends when a positive acknowledgement (ACK) is received in response to a packet transmitted in the HARQ session, and
   wherein a number of packets transmitted in the HARQ session is limited by the maximum transmission limit m.

2. The HARQ transmitter apparatus of claim 1, wherein the puncturing of the kth IR mother codeword removes a systematic segment of the kth IR mother codeword, wherein the systematic segment of the kth IR mother codeword is a subvector of the kth IR mother codeword, and wherein the systematic segment of the kth IR mother codeword carries the kth IR data segment in the systematic manner.

3. The HARQ transmitter apparatus of claim 2, wherein the HARQ encoder is further configured to apply a permutation to the kth IR data segment before encoding the kth IR data segment into the kth IR mother codeword in the systematic manner, whereby the systematic segment of the kth IR mother codeword carries a permuted copy of the kth IR data segment.

4. The HARQ transmitter apparatus of claim 2, wherein the kth IR mother codeword is shortened before being punctured and the puncturing of the kth IR mother codeword removes a shortened segment of the kth IR mother codeword.

5. The HARQ transmitter apparatus of claim 1, wherein the kth IR mother code is a systematic polar code.

6. The HARQ transmitter apparatus of claim 1, wherein the primary code is one of a systematic polar code or a non-systematic polar code.

7. The HARQ transmitter apparatus of claim 1, wherein the jth IR data segment is smaller in size than a size of the input data packet for each $1 \leq j \leq (m-1)$, and wherein the ith IR data segment is distinct from the jth IR data segment for any pair of integers i and j such that $1 \leq i < j \leq (m-1)$, thereby ensuring that the IR codes are distinct from each other and from the primary code.

8. A hybrid automatic repeat request (HARQ) receiver apparatus for use in generating an output data packet as an estimate of an input data packet transmitted in a communications system employing a HARQ protocol in a HARQ session with a maximum received packet limit m, wherein the maximum received packet limit m is an integer greater than or equal to 2, the HARQ receiver apparatus comprising:
   a receiver frontend configured to receive a received primary packet to produce a primary decoder input data;
   a HARQ decoder configured to process the primary decoder input data and generate a primary estimate of the input data packet;
   an error detector configured to detect errors in the primary estimate of the input data packet and release the primary estimate of the input data packet as the output data packet if no errors are detected in the primary estimate of the input data packet; and
   a feedback packet transmitter configured to transmit one of a positive acknowledgement (ACK) or a negative acknowledgement (NACK) depending on, respectively, whether the error detector detects an error in the primary estimate of the input data packet,
   wherein the received primary packet carries a primary codeword from a primary code, wherein the primary codeword is a codeword in the primary code corresponding to an encoding of the input data packet,
   wherein the receiver frontend is further configured, in response to the feedback packet transmitter transmitting k consecutive NACKs, to receive a kth received incremental redundancy (IR) packet to produce a kth IR decoder input data, wherein k is an integer value greater than or equal to 1 and less than or equal to (m−1),
   wherein the HARQ decoder is further configured to process a kth collection of decoder input data and generate a kth IR estimate of the input data packet, wherein the kth collection of decoder input data comprise the primary decoder input data and the jth IR decoder input data for each integer j=1, 2, . . . , k,
   wherein the error detector is further configured to detect errors in the kth IR estimate of the input data packet and release the kth IR estimate of the input data packet as the output data packet if no errors are detected in the kth IR estimate of the input data packet,
   wherein the feedback packet transmitter is further configured to transmit one of a positive acknowledgement (ACK) or a negative acknowledgement (NACK) depending on, respectively, whether the error detector detects an error in the kth IR estimate of the input data packet,
   wherein the kth received IR packet contains a kth IR codeword from a kth IR code, wherein the kth IR codeword is a punctured version of a kth IR mother codeword, wherein the kth IR mother codeword is a codeword from a kth IR mother code, wherein the kth IR mother codeword is the codeword in the kth IR mother code corresponding to a systematic encoding of a kth IR data segment, wherein the kth IR data segment is a subvector of the primary codeword, wherein the systematic encoding of the kth IR data segment comprises a mapping of the kth IR data segment to a systematic segment of the kth IR mother codeword, wherein the systematic segment of the kth IR mother codeword is a subvector of the kth IR mother codeword, wherein the subvector of the kth IR mother codeword carries the kth IR data segment in a systematic manner, wherein the punctured version of the kth IR mother codeword contains no elements from the systematic segment of the kth IR mother codeword, wherein the HARQ session ends when a positive acknowledgement (ACK) is transmitted in response to a packet received in the HARQ session, and wherein a number of received packets in the HARQ session is limited by the maximum received packet limit m.

9. The HARQ receiver apparatus of claim 8, wherein the HARQ decoder comprises a primary decoder and a collection of (m−1) IR decoders, wherein the primary decoder is a decoder configured to decode the primary code, wherein the collection of (m−1) IR decoders comprise, for each integer j=1, 2, . . . , (m−1), a jth IR decoder configured to decode the jth IR mother code, wherein, for each integer k greater than or equal to 1 and less than or equal to (m−1), the kth IR estimate of the input data packet is generated by a kth session of message passing among a kth collection of decoders, wherein the kth collection of decoders comprise the primary decoder and the jth IR decoder for each j=1, 2, . . . , k.

10. The HARQ receiver apparatus of claim 9, wherein, for each integer k greater than or equal to 1 and less than or equal to (m−1), the kth session of message passing comprises (1+k) decoding steps, wherein the (1+k) decoding steps comprise a primary code decoding step and a jth IR code decoding step for each integer j=1, 2, . . . , k, wherein the (1+k) decoding steps are executed sequentially in reverse order, starting with the kth IR code decoding step, followed by the (k−1)th IR code decoding step, down to the 1st IR code decoding step, and ending with the primary code decoding step, wherein in the jth IR code decoding step the jth IR decoder decodes the jth IR mother code to generate an estimate of the jth IR data segment, wherein the messages available to the jth IR decoder in the jth IR code decoding step comprise the jth IR decoder input data, a jth segment of the primary decoder input data, and the estimate of the lth IR data segment for each l=j+1, . . . , k, wherein the jth segment of the primary decoder input data comprises a segment of the primary decoder input data corresponding to the jth IR data segment, wherein in the primary code decoding step the primary decoder decodes the primary code to generate the kth estimate of the input data packet, wherein in the primary code decoding step the messages available to the primary decoder comprise the primary decoder input data and the estimate of the lth IR data segment for each l=1, . . . , k.

11. The HARQ receiver apparatus of claim 9, wherein, for each integer k greater than or equal to 1 and less than or equal to (m−1), the kth session of message passing comprises belief propagation decoding, wherein in the kth session of message passing the kth collection of decoders exchange messages in an unrestricted manner.

12. The HARQ receiver apparatus of claim 8, wherein the kth IR mother code is a systematic polar code.

13. The HARQ receiver apparatus of claim 8, wherein the primary code is one of a systematic polar code or a non-systematic polar code.

14. The HARQ receiver apparatus of claim 8, wherein the jth IR data segment is smaller in size than a size of the input data packet for each $1 \le j \le (m-1)$, and wherein the ith IR data segment is distinct from the jth IR data segment for any pair of integers i and j such that $1 \le i < j \le (m-1)$, thereby ensuring that the IR codes are distinct from each other and from the primary code.

15. A hybrid automatic repeat request (HARQ) transmission process for use in transmitting an input data packet in a communications system employing a HARQ protocol in a HARQ session with a maximum transmission limit m, wherein the maximum transmission limit m is an integer greater than or equal to 2, the HARQ transmission process comprising:

in a primary encoder, receiving an input data packet to start the HARQ session and encoding the input data packet into a primary codeword from a primary code;

in a packet transmitter, receiving the primary codeword and transmitting the primary codeword inside a primary packet over a communications channel;

in a systematic incremental redundancy (IR) encoder, selecting a kth IR data segment, encoding the kth IR data segment in a systematic manner into a kth IR mother codeword from a kth IR mother code, and producing a kth IR codeword from the kth IR mother codeword by a puncturing of the kth IR mother codeword, wherein the kth IR codeword is received in the packet transmitter and the kth IR codeword is transmitted by the packet transmitter inside a kth IR packet over the communications channel, wherein k is an integer greater than or equal to 1 and less than or equal to (m−1), wherein the kth IR data segment is a subvector of the primary codeword, wherein the kth IR packet is transmitted in response to receiving a kth negative acknowledgement (NACK) in the HARQ session, wherein the HARQ session ends when a positive acknowledgement (ACK) is received in response to a packet transmitted in the HARQ session, wherein the HARQ session ends when a positive acknowledgement (ACK) is transmitted in response to a packet received in the HARQ session, and wherein a number of packets transmitted in the HARQ session is limited by the maximum transmission limit m.

16. The HARQ transmission process of claim 15, wherein the puncturing of the kth IR mother codeword removes a systematic segment of the kth IR mother codeword, wherein the systematic segment of the kth IR mother codeword is a subvector of the kth IR mother codeword, and wherein the systematic segment of the kth IR mother codeword carries the kth IR data segment in the systematic manner.

17. The HARQ transmission process of claim 16, further comprising:

applying a permutation to the kth IR data segment in the HARQ encoder before encoding the kth IR data segment into the kth IR mother codeword in the systematic manner, whereby the systematic segment of the kth IR mother codeword carries a permuted copy of the kth IR data segment.

18. The HARQ transmission process of claim 16, wherein the kth IR mother codeword is shortened before being punctured and the puncturing of the kth IR mother codeword removes a shortened segment of the kth IR mother codeword.

19. The HARQ transmission process of claim 15, wherein the kth IR mother code is a systematic polar code.

20. The HARQ transmission process of claim 15, wherein the primary code is one of a systematic polar code or a non-systematic polar code.

21. The HARQ transmission process of claim 15, wherein the jth IR data segment is smaller in size than a size of the input data packet for each $1 \leq j \leq (m-1)$, and wherein the ith IR data segment is distinct from the jth IR data segment for any pair of integers i and j such that $1 \leq i < j \leq (m-1)$, thereby ensuring that the IR codes are distinct from each other and from the primary code.

22. A hybrid automatic repeat request (HARQ) reception process for use in generating an output data packet as an estimate of an input data packet transmitted in a communications system employing a HARQ protocol in a HARQ session with a maximum received packet limit m, wherein the maximum received packet limit m is an integer greater than or equal to 2, the HARQ reception process comprising:
  in a receiver frontend, receiving a received primary packet to produce a primary decoder input data;
  in a HARQ decoder, processing the primary decoder input data and generate a primary estimate of the input data packet;
  in an error detector, detecting errors in the primary estimate of the input data packet and release the primary estimate of the input data packet as the output data packet if no errors are detected in the primary estimate of the input data packet;
  in a feedback packet transmitter, transmitting one of a positive acknowledgement (ACK) or a negative acknowledgement (NACK) depending on, respectively, whether the error detector detects an error in the primary estimate of the input data packet,
  wherein the received primary packet carries a primary codeword from a primary code, wherein the primary codeword is a codeword in the primary code corresponding to an encoding of the input data packet; and
  in response to the feedback packet transmitter transmitting k consecutive NACKs, receiving a kth received incremental redundancy (IR) packet in the receiver frontend;
  producing a kth IR decoder input data, wherein k is an integer value greater than or equal to 1 and less than or equal to (m−1);
  processing a kth collection of decoder input data in the HARQ decoder and generating a kth IR estimate of the input data packet, wherein the kth collection of decoder input data comprise the primary decoder input data and the jth IR decoder input data for each integer j=1, 2, . . . , k;
  detecting errors in the kth IR estimate of the input data packet in the error detector and releasing the kth IR estimate of the input data packet as the output data packet if no errors are detected in the kth IR estimate of the input data packet;
  transmitting one of a positive acknowledgement (ACK) or a negative acknowledgement (NACK) from the feedback packet transmitter depending on, respectively, whether the error detector detects an error in the kth IR estimate of the input data packet,
  wherein the kth received IR packet contains a kth IR codeword from a kth IR code, wherein the kth IR codeword is a punctured version of a kth IR mother codeword, wherein the kth IR mother codeword is a codeword from a kth IR mother code, wherein the kth IR mother codeword is the codeword in the kth IR mother code corresponding to a systematic encoding of a kth IR data segment, wherein the kth IR data segment is a subvector of the primary codeword, wherein the systematic encoding of the kth IR data segment comprises a mapping of the kth IR data segment to a systematic segment of the kth IR mother codeword, wherein the systematic segment of the kth IR mother codeword is a subvector of the kth IR mother codeword, wherein the subvector of the kth IR mother codeword carries the kth IR data segment in a systematic manner,
  wherein the punctured version of the kth IR mother codeword contains no elements from the systematic segment of the kth IR mother codeword, and
  wherein a number of received packets in the HARQ session is limited by the maximum received packet limit m.

23. The HARQ reception process of claim 22, wherein the HARQ decoder comprises a primary decoder and a collection of (m−1) IR decoders,
  wherein the primary decoder is a decoder configured to decode the primary code, wherein the collection of (m−1) IR decoders comprise, for each integer j=1, 2, . . . , (m−1), a jth IR decoder configured to decode the jth IR mother code, wherein, for each integer k greater than or equal to 1 and less than or equal to (m−1), the kth IR estimate of the input data packet is generated by a kth session of message passing among a kth collection of decoders, wherein the kth collection of decoders comprise the primary decoder and the jth IR decoder for each j=1, 2, . . . , k.

24. The HARQ reception process of claim 23, wherein, for each integer k greater than or equal to 1 and less than or equal to (m−1), the kth session of message passing comprises (1+k) decoding steps, wherein the (1+k) decoding steps comprise a primary code decoding step and a jth IR code decoding step for each integer j=1, 2, . . . , k, wherein the (1+k) decoding steps are executed sequentially in reverse order, starting with the kth IR code decoding step, followed by the (k−1)th IR code decoding step, down to a first IR code decoding step, and ending with the primary code decoding step, wherein in the jth IR code decoding step the jth IR decoder decodes the jth IR mother code to generate an estimate of the jth IR data segment, wherein the messages available to the jth IR decoder in the jth IR code decoding step comprise the jth IR decoder input data, a jth segment of the primary decoder input data, and the estimate of the lth IR data segment for each l=j+1, . . . , k, wherein the jth segment of the primary decoder input data comprises a segment of the primary decoder input data corresponding to the jth IR data segment, wherein in the primary code decoding step the primary decoder decodes the primary code to generate the kth estimate of the input data packet, wherein in the primary code decoding step the messages available to the primary decoder comprise the primary decoder input data and the estimate of the lth IR data segment for each l=1, . . . , k.

25. The HARQ reception process of claim 23, wherein, for each integer k greater than or equal to 1 and less than or equal to (m−1), the kth session of message passing comprises belief propagation decoding, wherein in the kth session of message passing the kth collection of decoders exchange messages in an unrestricted manner.

26. The HARQ reception process of claim 22, wherein the kth IR mother code is a systematic polar code.

27. The HARQ reception process of claim 22, wherein the primary code is one of a systematic polar code or a non-systematic polar code.

28. The HARQ reception process of claim 22, wherein the jth IR data segment is smaller in size than a size of the input data packet for each $1 \leq j \leq (m-1)$, and wherein the ith IR data segment is distinct from the jth IR data segment for any pair of integers i and j such that $1 \leq i < j \leq (m-1)$, thereby ensuring that the IR codes are distinct from each other and from the primary code.

* * * * *